United States Patent
Dasgupta et al.

(10) Patent No.: US 11,777,022 B2
(45) Date of Patent: Oct. 3, 2023

(54) TRANSISTORS INCLUDING FIRST AND SECOND SEMICONDUCTOR MATERIALS BETWEEN SOURCE AND DRAIN REGIONS AND METHODS OF MANUFACTURING THE SAME

(71) Applicant: Intel Corporation, Santa Clara, CA (US)

(72) Inventors: Sansaptak Dasgupta, Portland, OR (US); Marko Radosavljevic, Portland, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 16/650,307

(22) PCT Filed: Jan. 12, 2018

(86) PCT No.: PCT/US2018/013602
§ 371 (c)(1),
(2) Date: Mar. 24, 2020

(87) PCT Pub. No.: WO2019/139621
PCT Pub. Date: Jul. 18, 2019

(65) Prior Publication Data
US 2020/0279939 A1    Sep. 3, 2020

(51) Int. Cl.
*H01L 29/778*    (2006.01)
*H01L 29/20*    (2006.01)
(Continued)

(52) U.S. Cl.
CPC ...... *H01L 29/7786* (2013.01); *H01L 29/2003* (2013.01); *H01L 29/24* (2013.01);
(Continued)

(58) Field of Classification Search
CPC ... H01L 29/2003; H01L 29/24; H01L 29/267; H01L 29/402; H01L 29/66462; H01L 29/7786
See application file for complete search history.

(56) References Cited

U.S. PATENT DOCUMENTS 6,521,961 B1 * 2/2003 Costa ............... H01L 29/66462
257/42
7,038,253 B2 * 5/2006 Yoshida ............. H01L 29/7787
257/190
(Continued)

FOREIGN PATENT DOCUMENTS

KR    1020130031690    3/2013

OTHER PUBLICATIONS

Shih et al., "Atomic Layer Deposition of Gallium Oxide Films as Gate Dielectrics in AlGaN/GaN Metal-Oxide-Semiconductor High-Electron-Mobility Transistors," Nanoscale Research Letters (2016) 11:235.*

(Continued)

*Primary Examiner* — Jay C Kim
(74) *Attorney, Agent, or Firm* — Essential Patents Group, LLP

(57) ABSTRACT

Methods, apparatus, systems and articles of manufacture are disclosed for transistors including first and second semiconductor materials between source and drain regions. An example apparatus includes a first semiconductor material and a second semiconductor material adjacent the first semiconductor material. The example apparatus further includes a source proximate the first semiconductor material and spaced apart from the second semiconductor material. The example apparatus also includes a drain proximate the second semiconductor material and spaced apart from the (Continued)

first semiconductor material. The example apparatus includes a gate located between the source and the drain.

19 Claims, 17 Drawing Sheets

(51) Int. Cl.
    *H01L 29/24*     (2006.01)
    *H01L 29/267*     (2006.01)
    *H01L 29/40*     (2006.01)
    *H01L 29/66*     (2006.01)

(52) U.S. Cl.
    CPC .......... *H01L 29/267* (2013.01); *H01L 29/402* (2013.01); *H01L 29/66462* (2013.01)

(56) References Cited

U.S. PATENT DOCUMENTS

| | | | |
|---|---|---|---|
| 7,253,061 B2 * | 8/2007 | Peng | H01L 21/02337 257/E21.639 |
| 7,834,366 B2 * | 11/2010 | Nakayama | H01L 29/802 257/94 |
| 8,035,128 B2 * | 10/2011 | Ikeda | H01L 29/66462 257/E29.081 |
| 8,330,167 B2 * | 12/2012 | Takehiko | H01L 29/4232 257/E21.409 |
| 8,344,422 B2 * | 1/2013 | Ando | H01L 29/7781 257/E33.048 |
| 8,860,089 B2 * | 10/2014 | Park | H01L 29/7787 257/194 |
| 8,890,212 B2 * | 11/2014 | Jeon | H01L 29/1066 438/483 |
| 8,907,377 B2 * | 12/2014 | Jeon | H01L 29/7786 257/194 |
| 8,946,771 B2 * | 2/2015 | Hsiung | H01L 29/7787 257/189 |
| 9,048,305 B2 * | 6/2015 | Shih | H01L 29/7787 |
| 9,111,956 B2 * | 8/2015 | Wong | H01L 21/8252 |
| 9,112,010 B2 * | 8/2015 | Lee | H01L 29/66462 |
| 9,147,738 B2 * | 9/2015 | Jeon | H01L 29/7787 |
| 9,231,093 B2 * | 1/2016 | Jeon | H01L 29/872 |
| 9,257,535 B2 * | 2/2016 | Lee | H01L 29/0673 |
| 9,312,350 B2 * | 4/2016 | Minoura | H01L 29/045 |
| 9,443,969 B2 * | 9/2016 | Wong | H01L 29/7787 |
| 9,455,342 B2 * | 9/2016 | Lu | H01L 29/405 |
| 9,502,549 B2 * | 11/2016 | Ikoshi | H01L 29/66462 |
| 9,570,597 B2 * | 2/2017 | Jeon | H01L 29/778 257/192 |
| 9,847,401 B2 * | 12/2017 | Chiu | H01L 21/02458 |
| 9,978,844 B2 * | 5/2018 | Wong | H01L 29/861 |
| 10,026,825 B2 * | 7/2018 | Lee | H01L 29/66462 257/190 |
| 10,541,322 B2 * | 1/2020 | Matsuda | H01L 21/02458 |
| 10,541,323 B2 * | 1/2020 | Boles | H01L 29/7786 |
| 10,553,712 B2 * | 2/2020 | Shrivastava | H01L 29/402 |
| 10,622,467 B2 * | 4/2020 | Boles | H01L 29/42312 |
| 10,636,916 B2 * | 4/2020 | Shih | H01L 29/7786 |
| 10,937,900 B2 * | 3/2021 | Liu | H01L 29/7787 257/76 |
| 2008/0237639 A1 | 10/2008 | Nanjo et al. | |
| 2010/0201439 A1 | 8/2010 | Wu et al. | |
| 2011/0012130 A1 | 1/2011 | Zhang | |
| 2013/0193485 A1 * | 8/2013 | Akiyama | H01L 29/778 257/194 |
| 2015/0054035 A1 | 2/2015 | Heo | |
| 2015/0187924 A1 * | 7/2015 | Dasgupta | H01L 29/7783 257/76 |
| 2015/0263116 A1 * | 9/2015 | Qiu | H01L 29/42372 257/194 |
| 2019/0019873 A1 * | 1/2019 | Shiozaki | H01L 29/66522 |

OTHER PUBLICATIONS

Li et al., "Scaling performance of Ga2O3/GaN nanowire field effect transistor," Journal of Applied Physics 114 (2013) 163706.*

Yu et al., "Short channel effects on gallium nitride/gallium oxide nanowire transistors," Applied Physics Letters 101 (2012) 183501.*

Stauffer, "Improving the transistor: Small device, big energy savings," MITEI (2010).*

Lee et al., "Dielectric characterization of transparent epitaxial Ga2O3 thin film on n-Ga N/Al2O3 prepared by pulsed laser deposition," Applied Physics Letters 89 (2006) 182906.*

International Search Report & Written Opinion dated Oct. 12, 2018, for PCT Patent Application No. PCT/US2018/013602.

International Preliminary Report on Patentability from PCT/US2018/013602 dated Jul. 23, 2020, 7 pgs.

* cited by examiner

TRANSISTORS INCLUDING FIRST AND SECOND SEMICONDUCTOR MATERIALS BETWEEN SOURCE AND DRAIN REGIONS AND METHODS OF MANUFACTURING THE SAME

CLAIM OF PRIORITY

This Application is a National Stage Entry of, and claims priority to, PCT Patent Application No. PCT/US2018/013602, filed on Jan. 12, 2018 and titled "TRANSISTORS INCLUDING FIRST AND SECOND SEMICONDUCTOR MATERIALS BETWEEN SOURCE AND DRAIN REGIONS AND METHODS OF MANUFACTURING THE SAME", which is incorporated by reference in its entirety for all purposes.

FIELD OF THE DISCLOSURE

This disclosure relates generally to semiconductors, and, more particularly, to transistors including first and second semiconductor materials between source and drain regions and methods of manufacturing the same.

BACKGROUND

Transistors can be fabricated using different methods and/or materials to achieve different performance characteristics. The voltage rating of a transistor is a function of the breakdown field of the semiconductor material that defines the channel through which current flows between the source and the drain when the transistor is switched on. In some applications, achieving high voltage ratings for transistors involves tradeoffs with other transistor performance characteristics (e.g., mobility).

Figure 1:
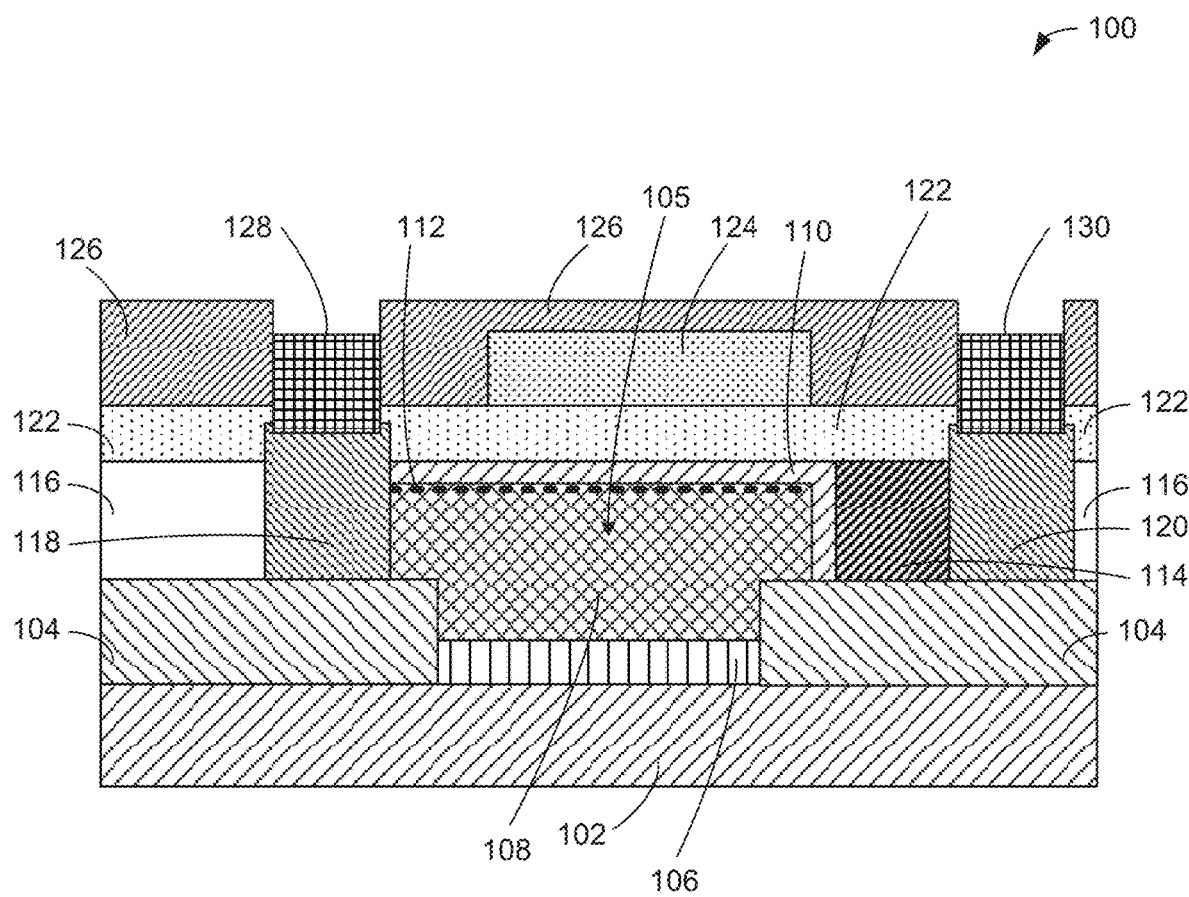
FIG. 1 is a cross-sectional view of an example transistor constructed in accordance with teachings disclosed herein.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

The performance of transistors is determined based on various characteristics of the semiconductor material used to form the transistors. One such characteristic is the electron or hole mobility (collectively referred to as carrier mobility) of the semiconductor material. Carrier mobility is a measure of the speed at which electrons and/or holes can move through the semiconductor material. Generally speaking, an increase in carrier mobility corresponds to an increase in transistor performance.

Another characteristic of semiconductor materials that influences the operation of transistors is the band gap of such materials, which is directly related to the breakdown voltage of the material. Breakdown voltage is defined as the maximum voltage that can be applied across a transistor without causing conduction in the reverse direction (e.g., from drain to source). Generally speaking, a wider band gap of a semiconductor material corresponds to a higher breakdown voltage for the semiconductor material. Applying a voltage greater than or equal to the breakdown voltage may result in irreparable damage to the transistor. Hence, it is desirable to fabricate transistors using materials with relative wide band gaps, particular in high voltage applications. Often, achieving particular performance characteristics in transistors involves tradeoffs with respect to other characteristics. For example, some semiconductor materials with a relatively wide band gap exhibit less carrier mobility than other materials with a lower band gap.

In addition to material properties, the geometry of structures in a transistor that define the spatial relationship and interconnections between the source, the drain, and the gate of a transistor also influences the performance characteristics of the transistor. Conventionally, one semiconductor material is used to extend between the source region and the drain region to define a channel of a transistor. A commonly used semiconductor material in transistors is gallium nitride (GaN), which has a relatively high carrier mobility (e.g., 440 cm$^2$/V·s) and a relatively wide band gap (e.g., 3.4 eV). However, the band gap of gallium nitride may be insufficient for certain high voltage applications (e.g., automotive applications, industrial applications, DC-DC convertors, etc.). As used herein, "high voltage" refers to voltages above 500 V. Transistors for such high voltage applications have typically been fabricated with materials that have wider band gaps than gallium nitride to achieve higher breakdown voltages. For example, one such material is gallium oxide, which has a band gap of approximately 4.9 eV. However, such materials have a much lower carrier mobility than gallium nitride (e.g., the carrier mobility of gallium nitride is approximately five times greater than the carrier mobility of gallium oxide). As a result, while transistors made with such materials are rated for high voltage applications, this comes at a cost to their performance because of the reduced carrier mobility.

Examples disclosed herein reduce and/or overcome the effects of the tradeoff between high breakdown voltage and high mobility. Some example transistors take advantage of the wide band gap of material used in high voltage applications in combination with materials that have a relatively high carrier mobility so as not to sacrifice transistor performance. More particularly, example transistors disclosed herein include multiple different semiconductor materials arranged in series between the source and drain regions. For example, a first semiconductor material with a carrier mobility of at least 200 cm$^2$/V·s may be used alongside a second semiconductor material with a band gap of at least 4 eV to yield a transistor with high breakdown voltage and high carrier mobility. In some examples, the first semiconductor material is gallium nitride (with a carrier mobility of approximately 440 cm$^2$/V·s) and the second semiconductor material is gallium oxide (with a band gap of approximately 4.9 eV). In some examples, the second semiconductor material may be aluminum nitride (with a band gap of approximately 6.2 eV) and/or diamond (with a band gap of approximately 5.4 eV). In some examples, the first semiconductor material has a higher carrier mobility than the second semiconductor material. In some examples, the first semiconductor material has a lower breakdown voltage than the second semiconductor material. In some examples, the length of the second semiconductor material (with the higher band gap) extending in a direction between the source and the drain can be designed to achieve any suitable breakdown voltage (e.g., based on a breakdown strength in MV/cm).

FIG. 1 is a cross-sectional view of an example transistor 100 constructed in accordance with teachings of this disclosure. The example transistor 100 includes an example semiconductor substrate 102 (e.g., a semiconductor wafer). The example semiconductor substrate 102 may include any suitable semiconductor material such as, for example, one or more of silicon, gallium, indium, etc. In the illustrated example, the semiconductor substrate 102 is substantially planar with the other components, features, and/or structures of the transistor 100 formed above the semiconductor substrate 102. As used herein, the term "above" is used with reference to the semiconductor substrate 102 on which components of the transistor 100 are formed. Specifically, as used herein, a first component of an integrated circuit is "above" a second component when the first component is farther away from the semiconductor substrate 102. Likewise, as used herein, a first component is "below" another component when the first component is closer to the semiconductor substrate 102. As used herein, the term "vertical" is defined as extending in a direction orthogonally away from the planar top surface of the semiconductor substrate 102.

As shown in FIG. 1, an example isolation material 104 is formed on the semiconductor substrate 102 to electrically isolate areas on the semiconductor substrate 102 from other materials disposed on the opposite side of the isolation material 104. The isolation material 104 may include any suitable dielectric material (e.g., an oxide). In some examples, the isolation material 104 extends into the semiconductor substrate 102 through shallow or deep trenches. In some examples, openings 105 are formed (e.g., via etching) in the isolation material 104 that extend therethrough to expose or uncover a region of the semiconductor substrate 102.

In the illustrated example of FIG. 1, the opening 105 in the isolation material 104 allows an example buffer layer 106 to be formed on the exposed or uncovered region of the semiconductor substrate 102. In some examples, the buffer layer 106 may have a thickness of fifty to one hundred nanometers. The example buffer layer 106 may include one or more of aluminum, gallium, and nitrogen. The buffer layer 106 enables the formation of materials (e.g., a first semiconductor material 108) on the buffer layer 106 that may not be formable directly on the semiconductor substrate 102. That is, in the illustrated example, the first semiconductor material 108 has a lattice mismatch or other structural characteristic that makes nucleation to initiate growth of the first semiconductor material 108 directly on the semiconductor substrate 102 difficult, if not impossible. In such an example, the buffer layer 106 is designed with a material and structure that enables growth of the first semiconductor material 108.

In some examples, the first semiconductor material 108 grows on the buffer layer 106 at a substantially constant rate in all directions. In some examples, the growth of the first semiconductor material 108 is such that the first semiconductor material 108 extends farther in one direction (e.g. either to the left or right from the perspective shown in FIG. 1) than in the opposite direction. In the illustrated example, the first semiconductor material 108 may correspond to any suitable semiconductor material with a high carrier mobility. In some examples, the first semiconductor material 108 includes gallium and nitride (e.g., GaN). As shown in FIG. 1, the example first semiconductor material 108 includes a top surface that is substantially parallel to the semiconductor substrate 102. The top surface of the first semiconductor 108 may be formed substantially parallel to the semiconductor substrate by virtue of the epitaxially growth process and/or made substantially parallel via a planarization process. In some examples, the first semiconductor material 108 is positioned such that the isolation material 104 is not between a portion of the first semiconductor material 108 and the semiconductor substrate 102.

The example first semiconductor material 108 of the illustrated example of FIG. 1 is coated with an example polarization layer 110. In some examples, the polarization layer 110 is applied as an even-thickness coating (e.g., twenty to thirty nanometers) on all exposed surfaces of the first semiconductor material 108 (e.g., the top surface and the side walls). In some examples, the polarization layer 110 includes one or more of aluminum, indium, gallium, and/or nitrogen. In the illustrated example, the interface between the first semiconductor material 108 and the example polarization layer 110 defines the location where an example controlled channel (represented by the dashed line 112) is activated when an example gate 124 is energized. More particularly, the controlled channel 112 may be generated within a thin layer of the first semiconductor material 108 at the interface with the polarization layer 110. The thin region corresponding to the controlled channel 112 defines a pathway along which current flows that is sometimes referred to as two-dimensional (2D) electron gas.

In the illustrated example of FIG. 1, the transistor 100 includes a second semiconductor material 114 positioned laterally in series with and adjacent the first semiconductor material 108. In some examples, the second semiconductor material 114 is grown off of the polarization layer 110. Thus, in the illustrated example, the polarization layer 110 is positioned between the first and second semiconductor materials 108, 114. In some examples, the second semiconductor material 114 grows laterally outward from the side wall and vertically upward to form a generally trapezoidal cross-sectional shape. In some examples, the second semiconductor material 114 may be grown with a cross-section in the general shape of a pentagon. The second semiconductor material 114 may grow in any other suitable shape or form.

The second semiconductor material 114 may correspond to any suitable semiconductor material that has a wide band gap. In some examples, the second semiconductor material 114 has a wider band gap than the first semiconductor material 108. In some examples, the second semiconductor material 114 has a carrier mobility less than the first semiconductor material 108. In some examples, the second semiconductor material 114 includes gallium and oxygen (e.g., $Ga_2O_3$). In some examples, the second semiconductor material 114 includes a dopant (e.g., tin, silicon, germanium, etc.) to enable electrical conduction through the second semiconductor material 114.

As mentioned above, the second semiconductor material 114 may be epitaxially grown off a surface or side wall (e.g., on the right side of the illustrated example in FIG. 1) of the polarization layer 110. In some examples, the portion of the polarization layer 110 positioned between the first and second semiconductor materials 108, 114 is removed (e.g., via etching) to expose a side wall of the first semiconductor material 108. In such examples, the second semiconductor material 114 may be grown off of the exposed side wall of the first semiconductor material 108. Thus, in some examples, the first semiconductor material 108 may be in direct contact with the second semiconductor material 114.

The example transistor 100 of FIG. 1 includes a source region 118 positioned adjacent the first semiconductor material 108 and a drain region 118 positioned adjacent the second semiconductor material 114. In some examples, the source region 118 is in contact with the first semiconductor material 108 and spaced apart from the second semiconductor material 114, whereas the drain region 120 is in contact with the second semiconductor material 114 and spaced apart from the first semiconductor material 108. In some examples, the source and drain regions 118, 120 include one or more of indium, gallium and/or nitrogen. In FIG. 1, example source and drain contacts 128, 130 are positioned on the respective source and drain regions 118, 120. The source and drain contacts 128, 130 may include any suitable metal (e.g., one or more of aluminum, tungsten, titanium, etc.)

In some examples, a dielectric material 116 (e.g., an oxide) is positioned adjacent the side walls of the source and drain regions 118, 120 opposite the first and second semiconductor materials 108, 114. Additionally, as shown in FIG. 1, the interface between the source and drain regions 118, 120 and the corresponding source and drain contacts 128, 130 is surrounded by an example high-k spacer 122. In some examples, the high-k spacer 122 extends between the source and drain regions 118, 120 above the first and second semiconductor 108, 114 (and the polarization layer 110) and below the gate 124. The example high-k spacer 122 is a dielectric with a relatively high dielectric constant (e.g., a dielectric constant greater than 9) to provide isolation between the source contact 128 and the drain contact 130. Example materials for the high-k spacer 122 include alumina ($Al_2O_3$), hafnia ($HfO_2$), zirconia ($ZrO_2$), silicon nitride ($Si_3N_4$), etc.

For electrical current to pass from the source contact 128 to the drain contact 130, the current passes, in series, through the source region 118, the first semiconductor material 108, the polarization layer 110, the second semiconductor material 114, and the drain region 120. Thus, in the illustrated example, both the first and second semiconductor materials 108, 114 correspond to separate portions of the electrical path between the source and drain regions 118, 120. Whether current flows along this path is controlled by the example gate 124 of FIG. 1. More particularly, the gate 124 controls the electrical conductivity of the first semiconductor material 108 (e.g., within the channel region 112) to either open or close the electrical flow path between the source and drain regions 118, 120. That is, when powered on, the gate 124 activates the controlled channel 112 at the interface between the top surface of the first semiconductor material 108 and the polarization layer 110. In this example, the controlled channel 112 corresponds to a first portion of the electrical path between the source and drain regions 118, 120. A second portion of the electrical path between the source and drain region 118, 120 corresponds to the second semiconductor material 114. Unlike the controlled channel 112 in the first semiconductor material 108, which functions as a 2D electron gas controlled by the gate 124, the gate 124 does not control the flow path through the second semiconductor material 114. Rather, current may flow through the second semiconductor material 114 as it would through a typical conductor. Such conduction in the second semiconductor material 114 is made possible by the dopant in the second semiconductor material 114.

In some examples, the gate 124 is positioned directly above (e.g., in vertical alignment with) the first semiconductor material 108 to facilitate the ability of the gate 124 to control the controlled channel 112. In some examples, the entire length of the gate 124 (extending in a direction between the source and drain regions 118, 120) is positioned between ends of the length of the first semiconductor material 108 such that any portion of the gate 124 is directly above a portion of the first semiconductor material 108. In some examples, the length of the gate 124 may extend or overlap more than half the length of the first semiconductor material 108 (e.g., 60%, 75%, 85%). In some examples, to increase the extent of the overlap, as shown in FIG. 1, a lateral side wall of the gate 124 facing toward the drain region 120 is substantially aligned (e.g., aligned within plus or minus twenty to fifty nanometers) with the side wall of the first semiconductor material 108 facing toward the drain region 120. Thus, in some examples, the gate 124 is laterally offset from the second semiconductor material 114 such that no portion of the gate 124 is directly above the second semiconductor material 114. In some examples, the gate 124 is positioned closer to the source than to the drain (e.g., a vertical centerline of the gate 124 may be closer to the source region 118 than to the drain region 120). In some examples, a distance between the gate 124 and the drain region 120 corresponds to a length of the second semiconductor material 114 in a direction extending between the source region 118 and the drain region 120.

As shown in the example of FIG. 1, the example gate 124 is positioned on the high-k spacer 122 between the source contact 128 and the drain contact 130. In some examples, a bottom surface of the gate 124 is in contact with a top surface of the high-k spacer 122. In some examples, the bottom surface of the gate 124 is slightly below (e.g., within twenty five percent of the thickness of the high-k spacer 122) the top surface of the high-k spacer 122. The example gate 124 may include any suitable metal (e.g., one or more of titanium, nitrogen, tungsten, nickel, plutonium, etc.).

In some examples, an example low-k spacer 126 is positioned between the gate 124 and the source and drain contacts 128, 130. The example low-k spacer 126 of the illustrated example of FIG. 1 is a dielectric with a relatively small dielectric constant (e.g. a dielectric constant that is less than or equal to five). The example low-k spacer 126 may include any suitable dielectric material (e.g., an oxide) or any porous dielectric material.

Figure 2:
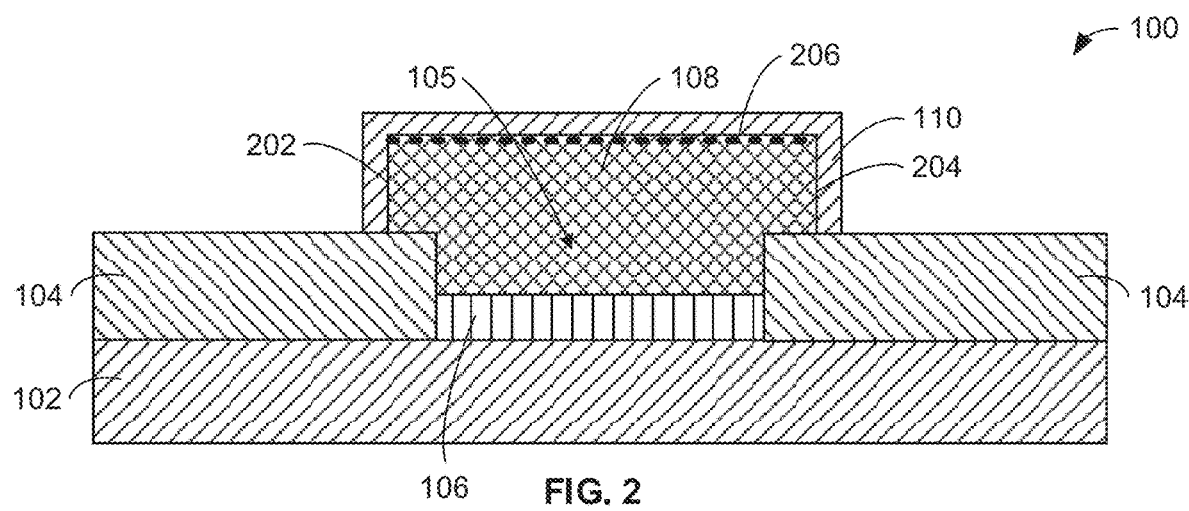
FIGS. 2-9 illustrate progressive stages in an example method of manufacturing the example transistor of FIG. 1.

FIGS. 2-9 illustrate progressive stages in an example method of manufacturing the example transistor 100 of FIG. 1. FIG. 2 is a cross-sectional view of the transistor 100 of FIG. 1 at an early stage in the manufacturing process. In particular. FIG. 2 represents the example transistor 100 after the formation of the isolation material 104, the buffer layer 106, the first semiconductor material 108, and the polarization layer 110. In some examples, these structures are fabrications by initially depositing a layer of the isolation material 104 on the semiconductor substrate 102. In the illustrated example, the opening 105 is formed (e.g., via etching) in the isolation material 104 at a location where the transistor 100 is to be formed. The example buffer layer 106 is then deposited on the semiconductor substrate 102 exposed within the opening 105 in the isolation material 104. The example buffer layer 106 may be epitaxially grown on the semiconductor substrate 102. The buffer layer 106 provides a surface upon which the first semiconductor material 108 may subsequently be formed. In some examples, the first semiconductor material 108 is formed directly on the semiconductor substrate 102 without the buffer layer 106 positioned therebetween. In some examples, the first semiconductor material 108 is epitaxially grown on the buffer layer 106 upward and outward to overgrow a top surface of the isolation material 104. In some examples, the first semiconductor material 108 is grown so that side walls 202, 204 are substantially perpendicular (e.g., perpendicular within plus or minus five degrees) to the isolation material 104 and to a top surface 206 of the first semiconductor material 108.

After the formation of the first semiconductor material 108, the polarization layer 110 is formed on exposed surfaces of the first semiconductor material 108 (e.g., the top surface 206 and the side walls 202, 204). The polarization layer 110 may be formed on the first semiconductor material 108 using any suitable deposition process.

Figure 3:
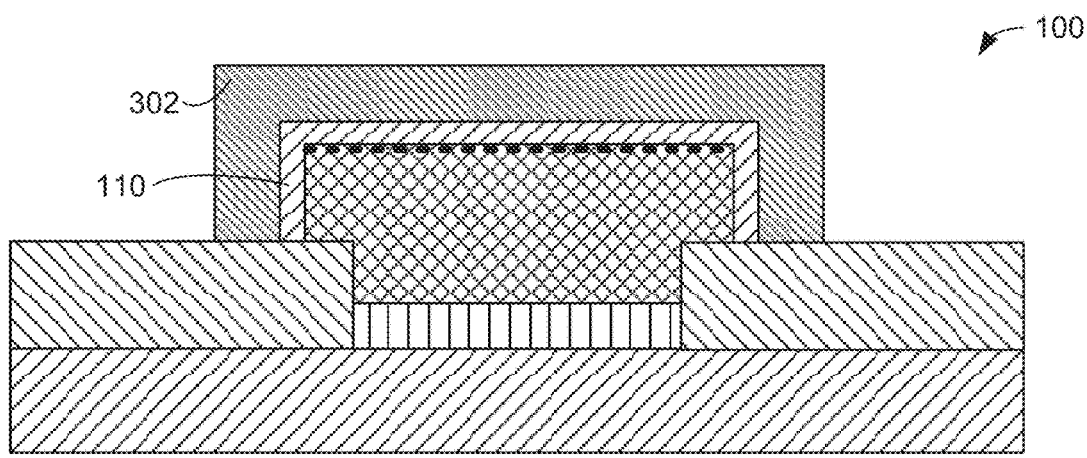

FIG. 3 is a cross-sectional view of the example transistor 100 as shown in FIG. 2 after a hardmask 302 is deposited over the polarization material 110. In the illustrated example of FIG. 3, the hardmask 302 is formed on all sides of the polarization layer 110. In some examples, the hardmask 302 may be selectively formed on areas where etching is to be performed. In some examples, the hardmask 302 may be a flowable oxide, including one or more of silicon and nitrogen.

Figure 4:
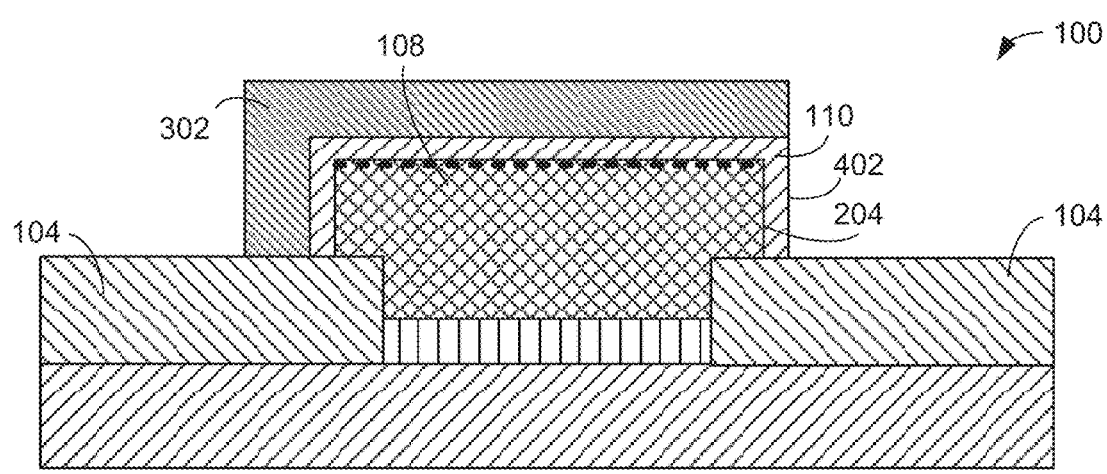

FIG. 4 is a cross-sectional view of the example transistor 100 as shown in FIG. 3 after removing (e.g., via etching) a portion of the hardmask 302 to expose a portion of the polarization material 110. As shown in the illustrated example, a side wall 402 of the polarization layer 110 is exposed by the removal of the hardmask 302. In some examples, the side wall 402 of the polarization layer 110 is etched along with the hardmask 302 to expose the underlying side wall 204 of the first semiconductor material 108.

Figure 5:
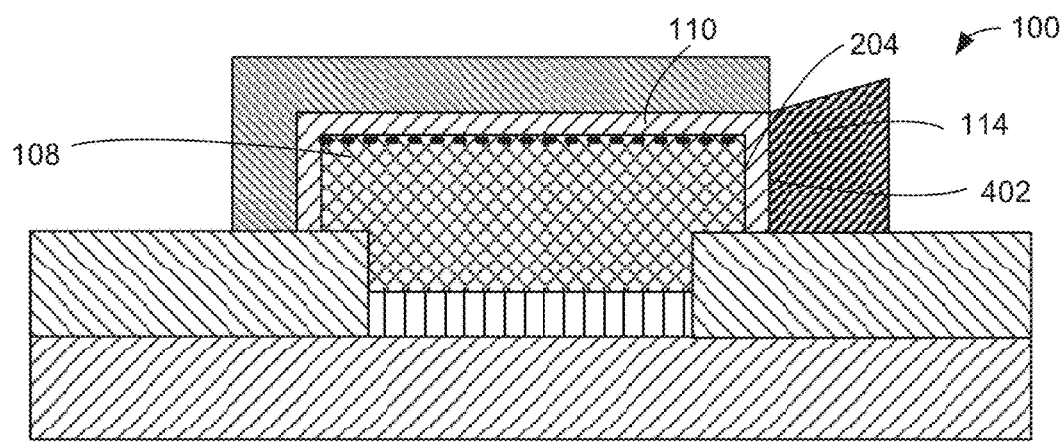

FIG. 5 is a cross-sectional view of the example transistor 100 as shown in FIG. 4 after the formation of the second semiconductor material 114 adjacent the first semiconductor material 108. In the illustrated example of FIG. 5, the second semiconductor material 114 is epitaxially grown off the exposed side wall 402 of the polarization layer 110. Thus, as shown in the illustrated example, the polarization layer 110 is positioned between the first and second semiconductor materials 108, 114. In other examples, where the side wall 402 of the polarization layer 110 is removed, the second semiconductor material 114 may be epitaxially grown directly off of the exposed side wall 204 of the first semiconductor material 108. The example second semiconductor material 114 may be formed in any suitable shape using any suitable deposition method. In some examples, the formation of the second semiconductor material 114 may be timed, or otherwise controlled, to epitaxially grow the second semiconductor material 114 with a particular length extending away from a side wall of the first semiconductor material 108. In such examples, the length may correspond to a voltage rating designated for an integrated circuit and based on a breakdown voltage of the second semiconductor material 114. In some examples, the example second semiconductor material 114 is doped with a conductive metal (e.g., tin) during the epitaxial growth. In other examples, the second semiconductor material 114 is doped after the epitaxial growth process.

Figure 6:
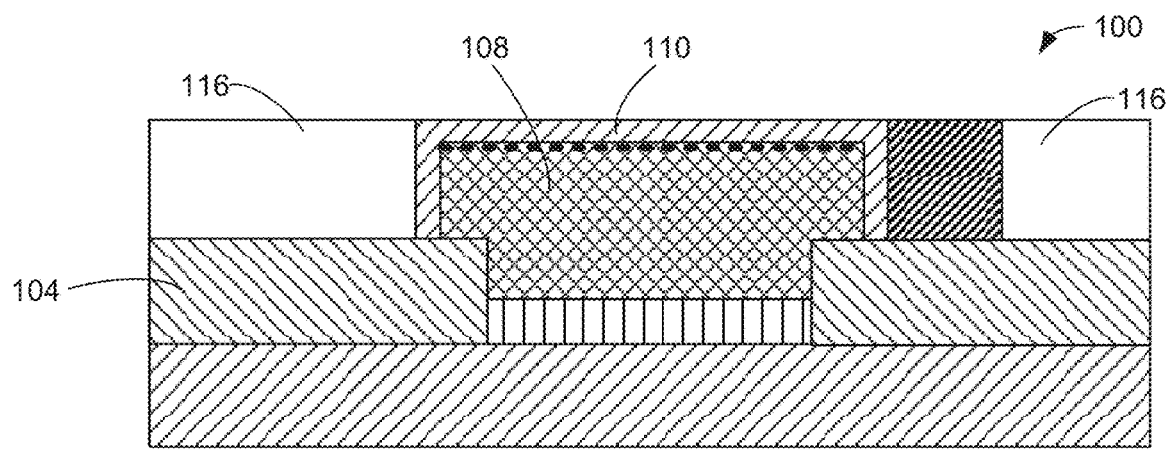

FIG. 6 is a cross-sectional view of the example transistor 100 as shown in FIG. 5 after any upwardly protruding portions of the second semiconductor material 114 have been planarized. The second semiconductor material 114 may protrude upwards because of the way the material is epitaxially grown off the side wall of the polarization layer 110 (or side wall of the first semiconductor material 108). As shown in FIG. 1, the second semiconductor material 114 is planarized to be made even with or substantially coplanar (e.g., aligned with and substantially parallel) to a top surface of the polarization layer 110. In some examples, the planarization process may remove a portion of the polarization layer 110.

Prior the planarization process represented in FIG. 6, the hardmask 302 may be removed (e.g., via etching). In some examples, at least some of the hardmask 302 is removed during the planarization process. Additionally, before planarization, the dielectric material 116 is deposited on the isolation material 104 adjacent the first and second semiconductor materials 108, 114, as shown in FIG. 6. In the illustrated example of FIG. 6, the dielectric material 116 is made even with the top surface of the polarization layer 110 and the second semiconductor material 114 by virtue of the planarization process.

Figure 7:
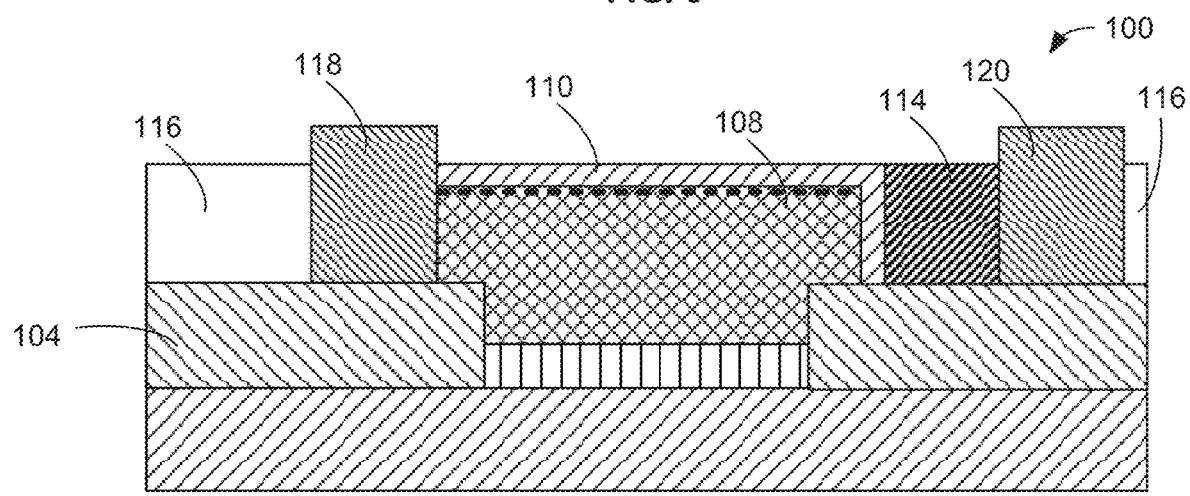

FIG. 7 is a cross-sectional view of the example transistor 100 as shown in FIG. 6 after the formation of the source and drain regions 118, 120. In some examples, the dielectric material 116 is removed (e.g., via etching) at locations next to both the first and second semiconductor materials 108, 114, to create areas for the growth of the drain and source regions 118, 120. In some examples, the polarization layer 110 on the side wall of the first semiconductor material 108 opposite the second semiconductor material 114 is removed along with the dielectric material 116 so that the source region 118 directly contacts the first semiconductor material 108. In some examples, the source and drain regions 118, 120 and may be epitaxially grown within the areas where the dielectric material 116 was removed adjacent the respective first and second semiconductor materials 108, 114. In some examples, the source and drain regions 118, 120 are grown to a height extending above the top surface of the polarization layer 110. In some examples, the source and drain regions 118, 120 are doped with a suitable dopant to enhance electrical connectivity with the source and drain contacts 128, 130 to be added thereafter.

Figure 8:
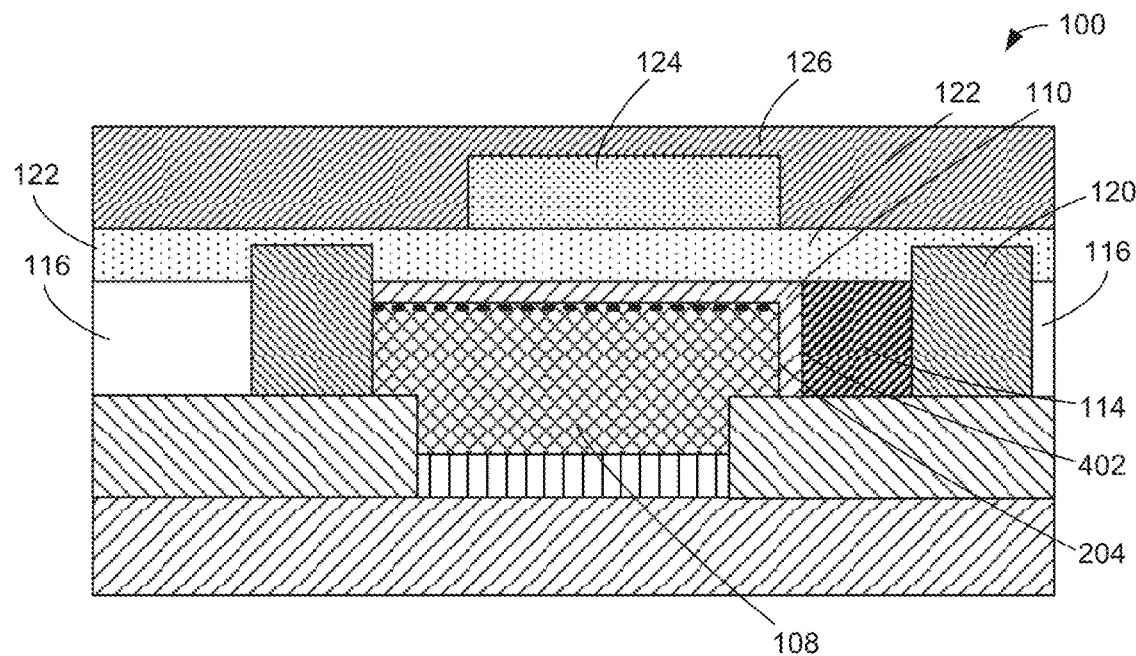

FIG. 8 is a cross-sectional view of the example transistor 100 as shown in FIG. 7 after the formation of the gate 124. In the illustrated example of FIG. 8, before the gate 124 is formed, the example high-k spacer 122 is deposited on the dielectric material 116, the drain region 120, the second semiconductor material 114, the polarization layer 110, and the source region 118. As shown in FIG. 8, the example gate 124 is formed on the high-k spacer 122 to be in vertical alignment with first semiconductor material 108. While the gate 124 is shown in FIG. 1 as being formed on top of the high-k spacer 122, in some examples, an etch may be made into the high-k spacer 122 to create an indent into which the gate 124 is formed. The example gate 124 of the illustrated example of FIG. 8 has a rectangular cross section. In other examples, the gate 124 may be any other suitable shape with any suitable cross-section.

FIG. 8 further represents the deposition of the low-k spacer 126 on the high-k spacer 122 and over the gate 124, thereby isolating the active components of the example transistor 100 from subsequent metallization layers.

Figure 9:
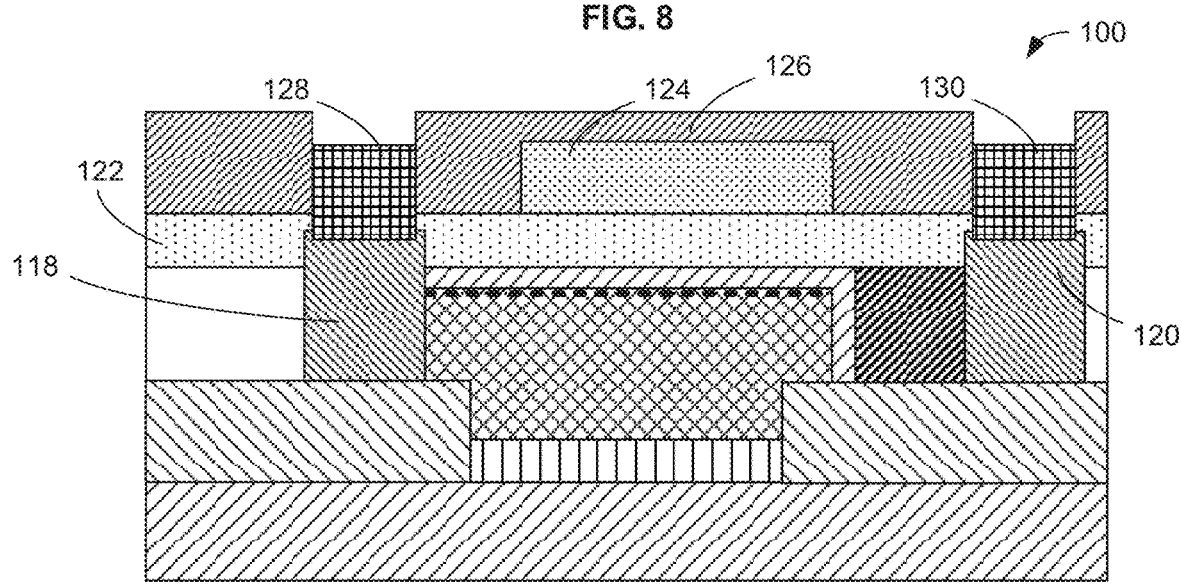

FIG. 9 is a cross-sectional view of the example transistor 100 as shown in FIG. 8 after forming the source contact 128 and the drain contact 130. In some examples, the source and drain contacts 128, 130 are formed by first etching through the low-k spacer 126 and the high-k spacer 122 down to the source and drain regions 118, 120. In the illustrated example of FIG. 9, the source and drain regions 118, 120 are etched to create recessed regions in the top surface of the source and drain regions 118, 120. Subsequently, the material for the source and drain contacts 128, 130 may be deposited into the recessed regions of the source and drain regions 118, 120 within the etched regions of the spacers 122, 126 to establish an electrical connection with the source and drain regions 118, 120. In some examples, the recessed regions may not be etched into the source and drain regions 118, 120. In such examples, the source contact 128 is deposited on the top surface of the source region 118 and the drain contact 130 is deposited on the top surface of the drain region 120.

The stage of manufacturing represented by FIG. 9 corresponds to the completion of the fabrication process of the example transistor 100 of FIG. 1. That is, the example transistor 100 as shown in FIG. 9 is the same as the example transistor 100 as shown in FIG. 1. While FIGS. 2-9 represent progressive stages of an example method of manufacturing the example transistor of FIG. 1, the example transistor 100 shown in FIGS. 1 and 9 may undergo subsequent fabrication processes to interconnect the example transistor with other transistors or other semiconductor devices to form a complete integrated circuit.

Figure 10:
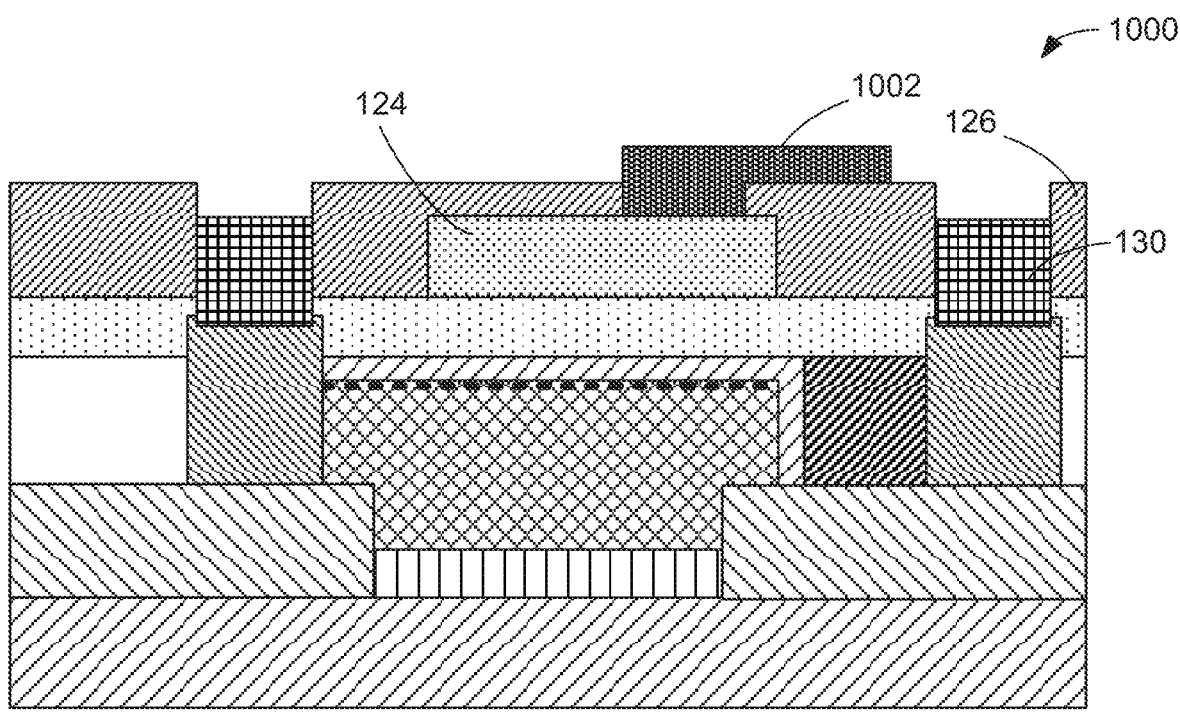
FIG. 10 is a cross-sectional view of another example transistor constructed in accordance with teachings disclosed herein.

FIG. 10 is a cross-sectional view of another example transistor 1000 that is similar to the example transistor 100 of FIG. 9. Accordingly, for purposes of explanation, similar reference numbers will be used for similar components. The example transistor 1000 shown in FIG. 10 differs from the example transistor 100 shown in FIG. 9 in that the transistor 1000 of FIG. 10 includes an example field plate 1002 connected to the gate 124. In some examples, the field plate 1002 is formed by etching through the low-k spacer 126 to expose the top surface of the gate 124. The example field plate 1002 is then deposited on the gate 124. Additionally, in some examples, the field plate 1002 is structured to extend laterally along the top surface of the low-k spacer 126 to overlap at least some of the distance between the gate 124 and the drain contact 130. The example field plate 1002 structured in this manner functions to distribute the electric field generated by the gate 124 in the region surrounding the gate 124 and the drain contact 130 to improve the breakdown voltage of the transistor 1000. The field plate 1002 may include one or more of tungsten, titanium, gold, and/or copper. The example field plate 1002 is electrically isolated from the drain contact 130 by the low-k spacer 126. The example field plate 1002 of FIG. 10 may be well suited to transistors when the gate 124 has a length that is relatively long (e.g., exceeds two hundred nanometers). In some examples, the field plate 1002 may be included in transistors with a gate having a length that is less than two hundred nanometers. In some examples, the field plate 1002 is not included, as in the example transistor 100 of FIG. 9.

Figure 11:
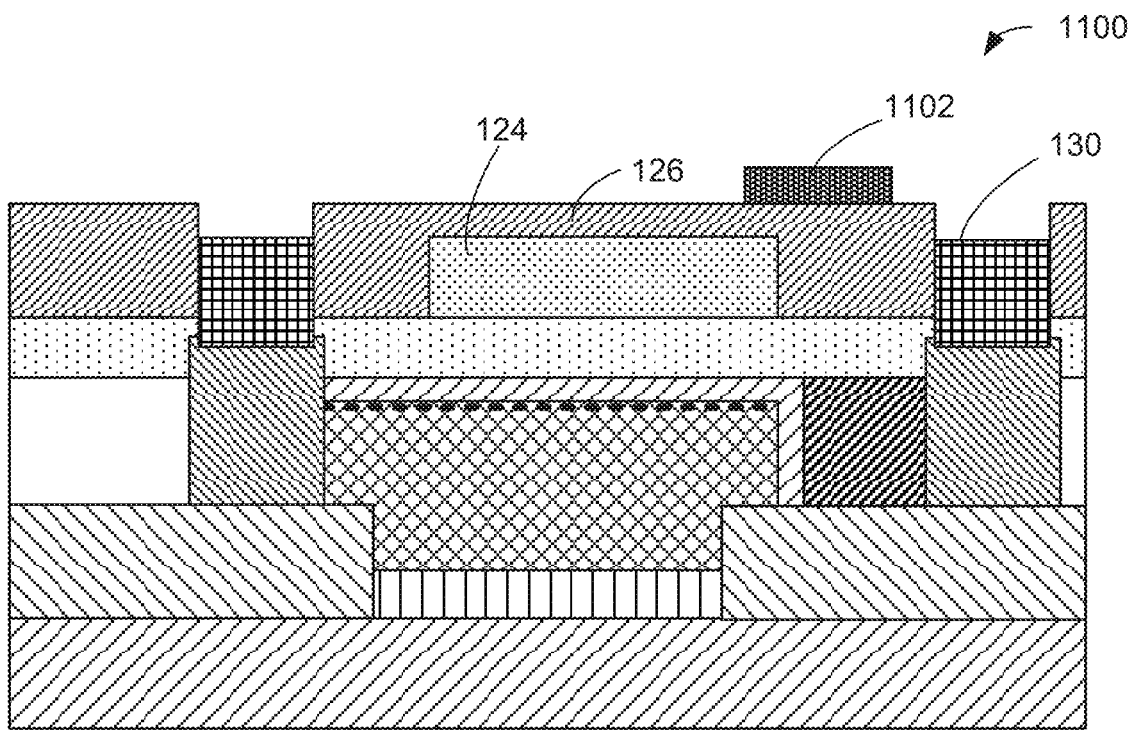
FIG. 11 is a cross-sectional view of another example transistor constructed in accordance with teachings disclosed herein.

FIG. 11 is a cross-sectional view of another example transistor 1100 similar to the example transistor 1000 of FIG. 10. Accordingly, for purposes of explanation, similar reference numbers will be used for similar components. As shown in FIG. 11, the example transistor 1100 shown in FIG. 11 includes a field plate 1102. As with the field plate 1002 of FIG. 10, the example alternative field plate 1102 of FIG. 11 extends laterally across the top of the low-k spacer 126 to overlap at least a portion of the distance between the gate 124 and the drain contact 130. However, unlike the field plate 1002 shown in FIG. 10, the example field plate 1102 of FIG. 11 is not directly connected to the top surface of the gate 124. Rather, in some examples, the example field plate 1102 of FIG. 11 is indirectly connected to the gate 124 via metal interconnects in a higher metal level. The example field plate 1102 of FIG. 11 may be well suited for transistors when the gate 124 has a length that is relatively short (e.g., less than two hundred nanometers).

Figure 12:
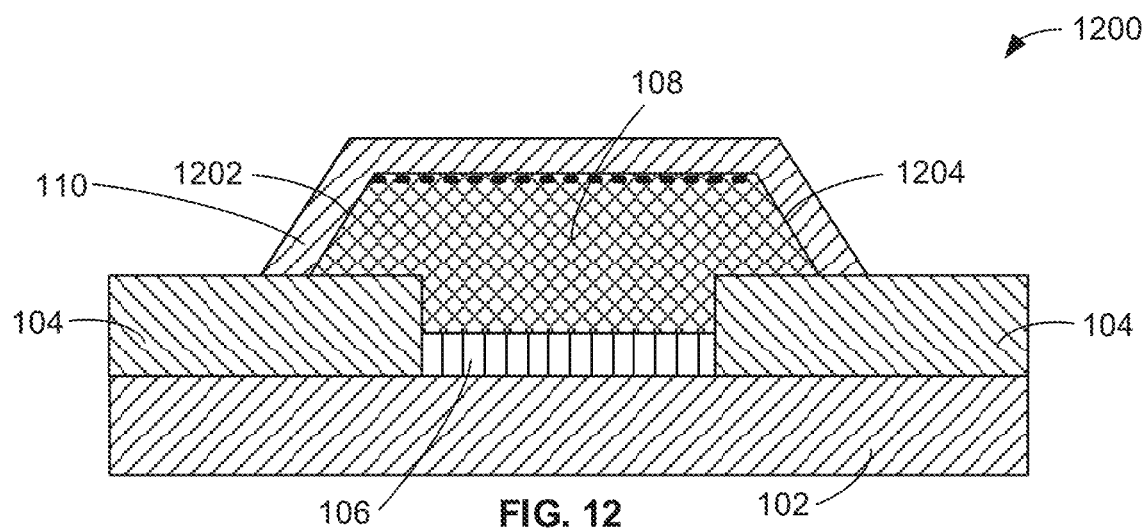
FIGS. 12-15 illustrate progressive stages in an example method of manufacturing another example transistor constructed in accordance with the teachings disclosed herein.
Figure 13:
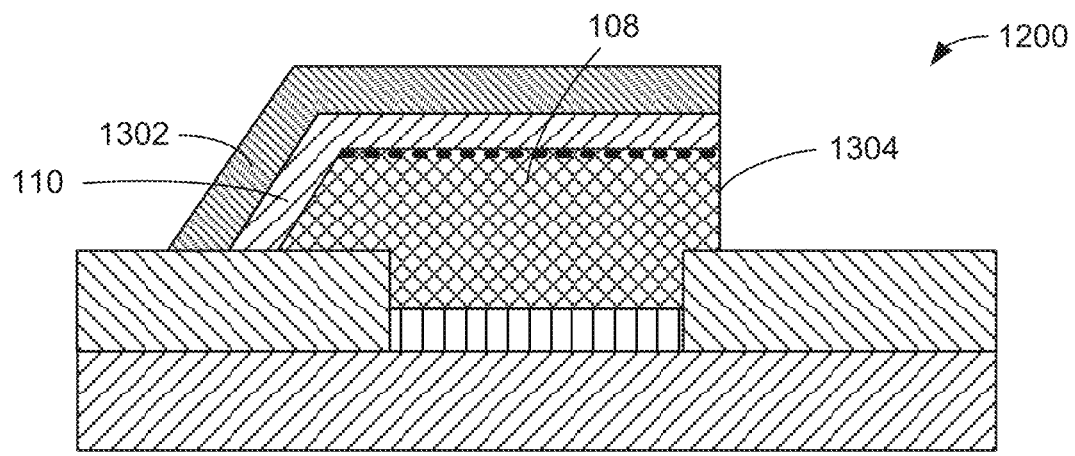
Figure 14:
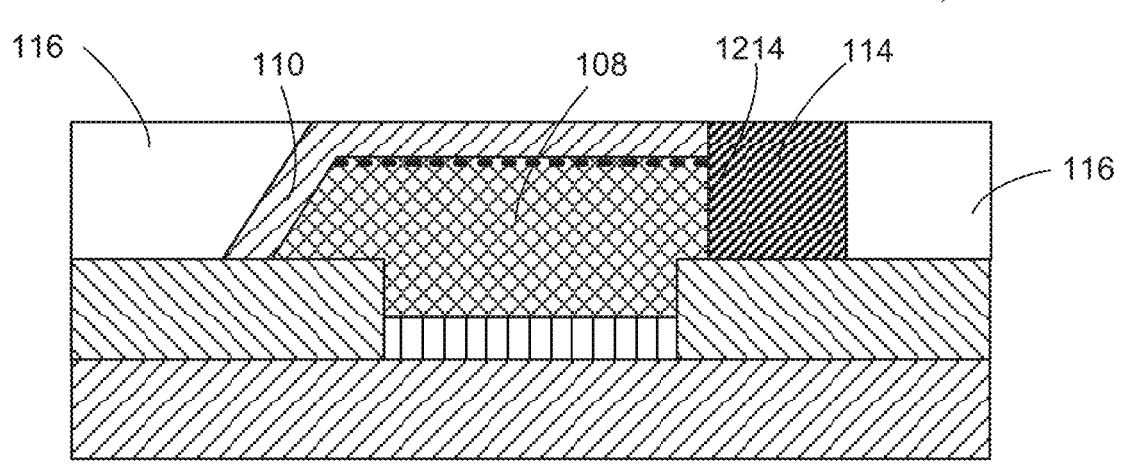

FIGS. 12-14 illustrate stages in an example method of manufacturing another example transistor 1200 constructed in accordance with teachings disclosed herein. FIG. 12 is a cross-sectional view of the example transistor 1200 at a similar stage of fabrication of the transistor 100 represented in FIG. 2. The example transistor 1200 shown in FIG. 12 differs from the example transistor 100 shown in FIG. 2 in that the first semiconductor material 108 of the transistor 1200 of FIG. 12 overgrows the isolation material 104 with angled side walls 1202 and 1204. As a result, in some examples, the angled side walls 1202, 1204 face upwards and away from the semiconductor substrate 102 at an angle of approximately sixty degrees (e.g., plus or minus five degrees) from a direction parallel to the semiconductor substrate 102. In some examples, the orientation and/or process conditions may be altered to result in the first semiconductor material 108 growing in different geometries (e.g., with different side wall angles). After the growth of the first semiconductor material 108, as shown in FIG. 12, the example polarization layer 110 is deposited on the exposed surfaces of the first semiconductor material 108. As a result, in the illustrated example, the polarization layer 110 is defined by lateral side walls that are angled in a similar manner to the side walls 1202, 1204 of the first semiconductor material 108.

FIG. 13 is a cross-sectional view of the example transistor 1200 as shown in FIG. 12 after the application of a hardmask 1302 and the subsequent removal of the polarization layer 110 at the side wall 1204 of the first semiconductor material 108. Further, as shown in the illustrated, a portion of the first semiconductor material 108 is removed (e.g., via etching) to form a substantially vertical side wall 1304 that is exposed to the external environment.

FIG. 14 is a cross-sectional view of the example transistor 1200 shown in FIG. 13 after the formation of the second semiconductor material 114 adjacent the first semiconductor material 108. In this example, the second semiconductor material 114 is grown off the exposed vertical side wall 1304 of the first semiconductor material 108. Thus, unlike the example transistors 100, 1000, 1100 of FIGS. 1-11, the first and second semiconductor materials 108, 114 in the example transistor 1200 of FIGS. 12-14 are in direction contact with no polarization material 110 positioned therebetween.

FIG. 14 further represents the removal of the hardmask 1302, the deposition of the dielectric material 116, and the planarization of the formed structures so that the top surface of the second semiconductor material 114 is substantially coplanar to (e.g., substantially parallel to, and aligned with) the top surface of the polarization layer 110. In some examples, the subsequent manufacturing processes to complete the example transistor 1200 represented in FIG. 14 may generally follow the same or similar processes used to form the example transistor 100 of FIG. 1 as described above in connection with FIGS. 6-9.

Figure 15:
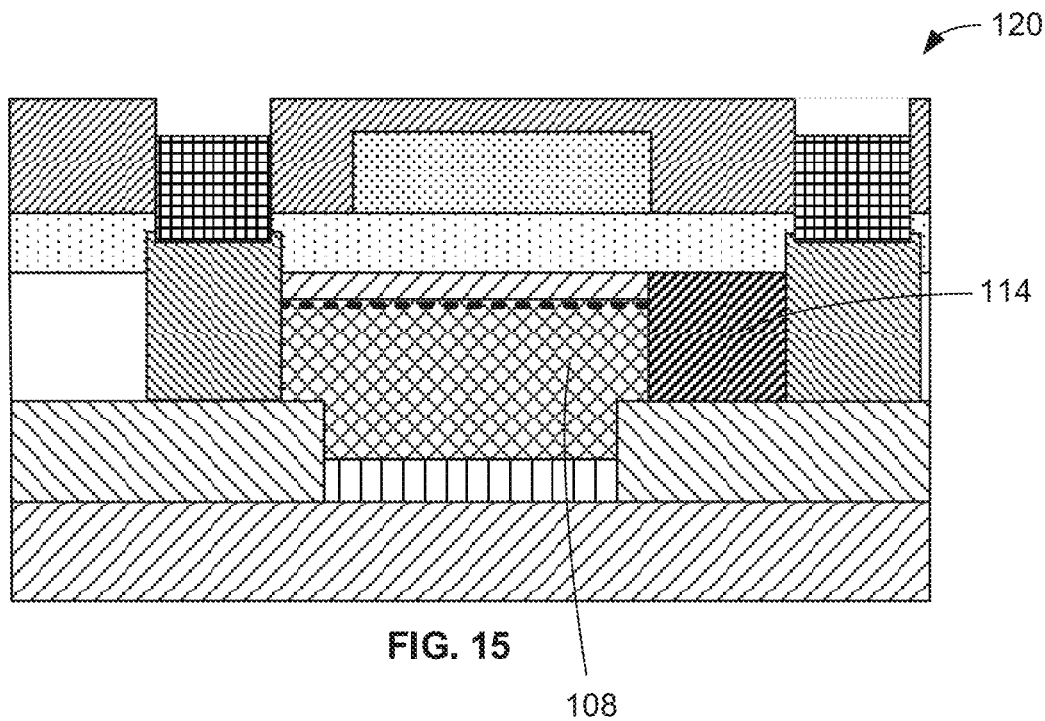

FIG. 15 illustrates the example transistor 1200 as shown in FIG. 14 after subsequent fabrication processes through the deposition of the source and drain contacts 128, 130 have been completed in a similar manner as described above in connection with FIGS. 6-9.

Figure 16:
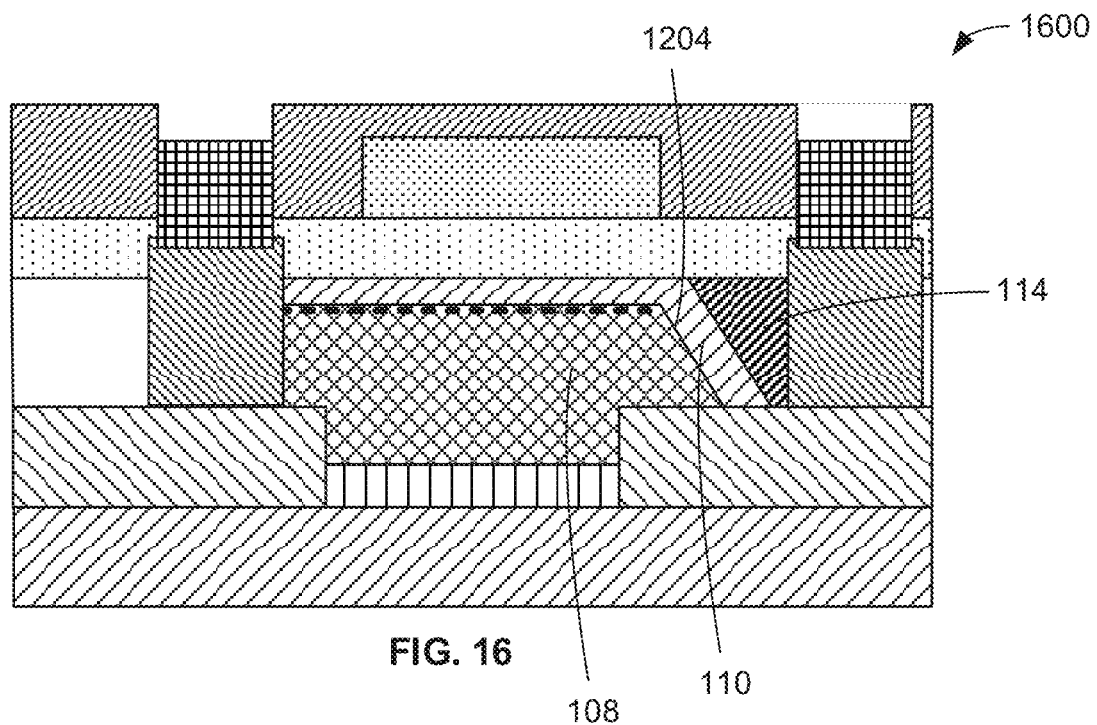
FIG. 16 is a cross-sectional view of another example transistor constructed in accordance with teachings disclosed herein.

FIG. 16 is a cross-sectional view of another example transistor 1600. The example transistor 1600 of FIG. 16 includes the first semiconductor substrate 108 with the angled side wall 1204 as shown in FIG. 12. However, rather than etching the angled side wall 1204 to form the vertical side wall 1304 as shown in FIG. 13, the angled side wall 1204 is retained during subsequent fabrication processes. More particularly, as shown in FIG. 16, the angled side wall 1204 of the first semiconductor material 108 is covered by the polarization layer 110. Further, in the illustrated example of FIG. 16, the second semiconductor material 114 is formed (e.g., via epitaxially growth) directly on the angled portion the polarization layer 110. In some examples, the polarization layer 110 may be removed (e.g., via etching) to expose the angled side wall 1204 of the first semiconductor material 108. In such examples, the second semiconductor material 114 may then be formed (e.g., via epitaxial growth) directly off the angled side wall 1204 of the first semiconductor material 108.

Figure 17:
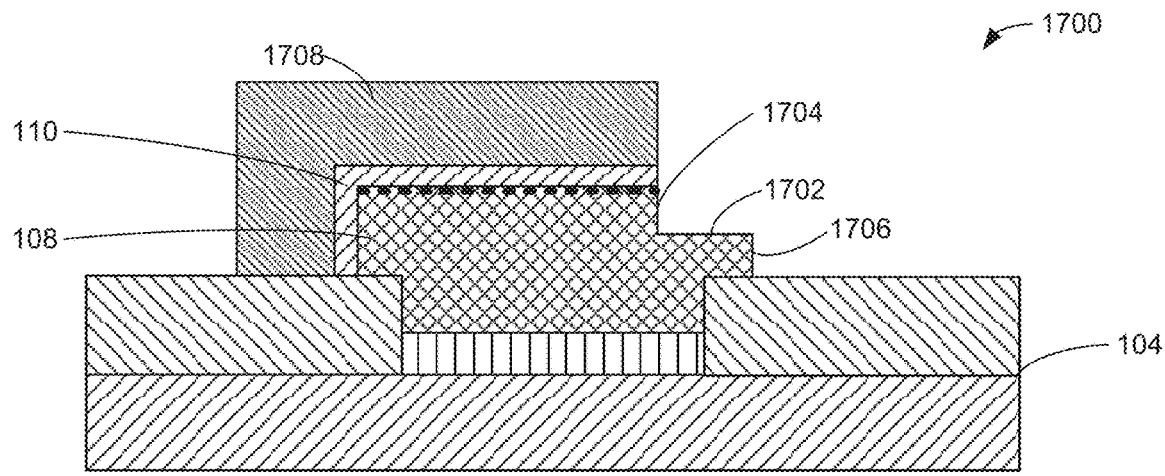
FIGS. 17-20 illustrate progressive stages in an example method of manufacturing another example transistor constructed in accordance with teachings disclosed herein.

FIGS. 17-20 illustrates stages in an example method of manufacturing an example transistor 1700 constructed in accordance with teachings disclosed herein. FIG. 17 is a cross-sectional view of the example transistor 1700 after the first semiconductor material 108 has been formed and the polarization layer 110 has been deposited thereon. Further, FIG. 17 shows a portion of the first semiconductor material 108 having been removed (e.g., via etching) to define a recessed surface 1702 that is below the top surface of the first semiconductor material 108 and extends between an inner lateral surface 1704 and an outer side wall 1706. In some example, the portion of the first semiconductor material 108 removed may be controlled by first depositing a hardmask 1708 on to the polarization layer 110 as shown in FIG. 17. In some examples, the recessed region created in the first semiconductor material 108 may be of any suitable shape or form. In the illustrated example of FIG. 17, the recessed surface 1702 is substantially parallel to the top surface of the first semiconductor material 108 and the inner lateral surface 1704 is substantially perpendicular to the top surface of the first semiconductor material 108. As shown in FIG. 17, the depth of the recessed surface 1702 is less than a distance between the top surface of the first semiconductor material 108 and the top surface of the isolation material 104.

Figure 18:
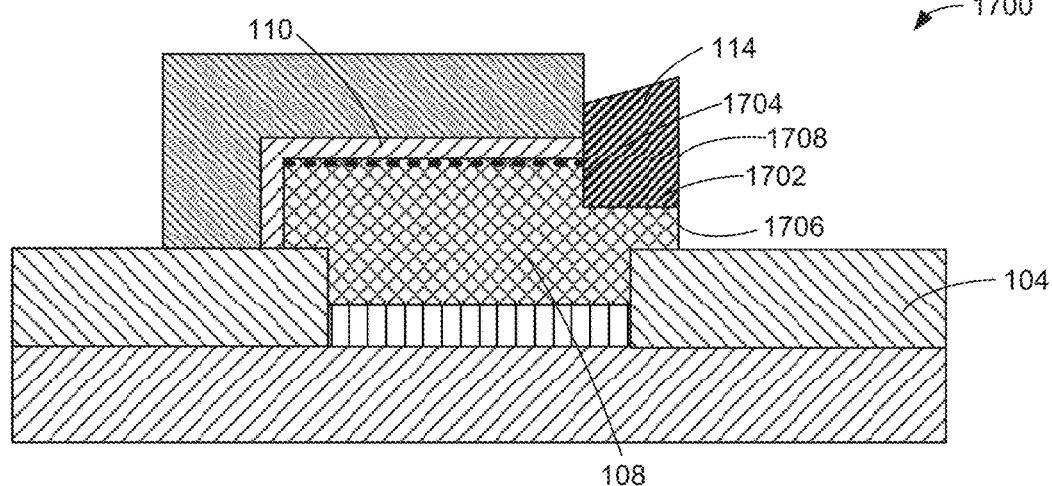

FIG. 18 is a cross-sectional view of the example transistor 1700 as shown in FIG. 17 after the formation of the second semiconductor material 114. In the illustrated example of FIG. 18, the second semiconductor material 114 is epitaxially grown off the recessed surface 1702. Additionally or alternatively, the second semiconductor material 114 is epitaxially grown off the inner lateral surface 1704 of the first semiconductor material 108. In such examples, the first semiconductor material 108 extends under the second semiconductor material 114. Thus, a portion of the first semiconductor material 108 is positioned between the second semiconductor material 114 and the isolation material 104. In the illustrated example of FIG. 18, the second semiconductor material 108 partially overlaps the isolation material 104. In other examples, the first semiconductor material 108 is grown further to the side so that the entire length of the second semiconductor material 114 overlaps the isolation material 104.

In some examples, the example second semiconductor material 114 is formed with a top surface that is angled and protrudes above the top surface of the polarization layer 110. In some examples, the second semiconductor material 114 may be formed in the general shape of a pentagon, a trapezoid, or in any other geometry. In the illustrated example of FIG. 18, the second semiconductor material 114 is grown with an outer lateral side wall 1708 that is substantially parallel to the outer side wall 1706 of the first semiconductor material 108. In other examples, the second semiconductor material 114 may extend beyond, or extend short of, the outer side wall 1706 of the first semiconductor material 108.

Figure 19:
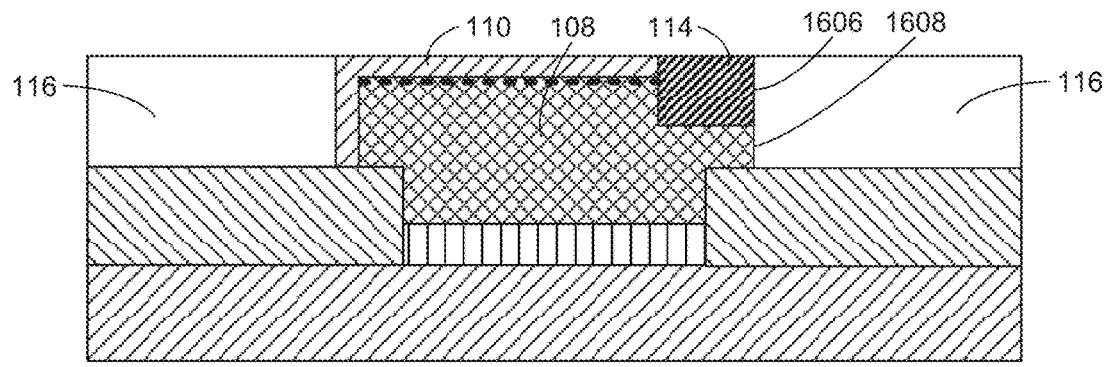
Figure 20:
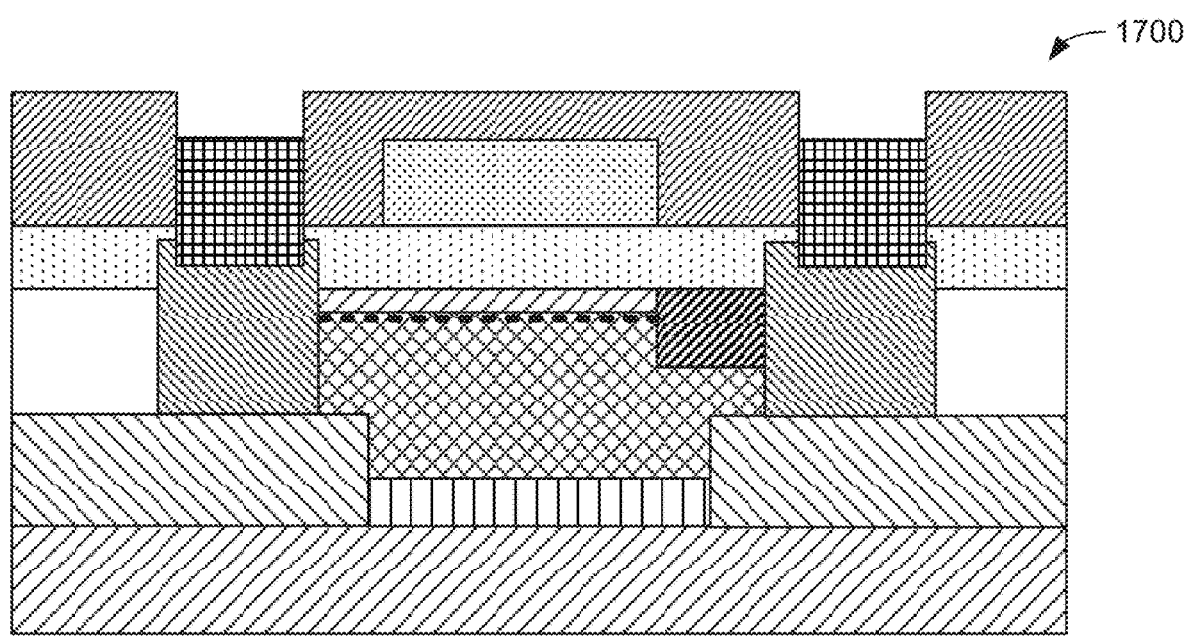

FIG. 19 is a cross-sectional view of the example transistor 1700 as shown in FIG. 18 after the removal of the hardmask 1708 and the formation of the dielectric material 116. FIG. 19 further represents the planarization of the top surface of the second semiconductor material 114 to be made substantially even (e.g., substantially coplanar) with the top surface of the polarization layer 110. In some examples, the subsequent manufacturing processes to complete the example transistor 1700 represented in FIG. 19 may generally follow the same or similar processes used to form the example transistor 100 of FIG. 1 as described above in connection with FIGS. 6-9. FIG. 20 illustrates the example transistor 1700 as shown in FIG. 19 after subsequent fabrication processes through the deposition of the low-k spacer 126 have been completed in a similar manner as described above in connection with FIGS. 6-9.

Figure 21:
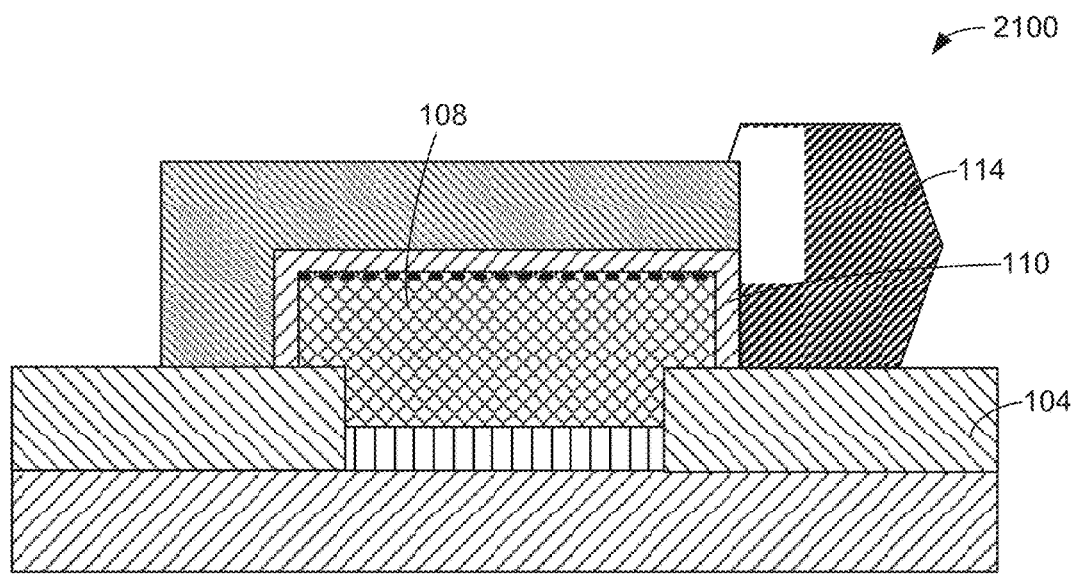
FIG. 21 is a cross-sectional view of another example transistor constructed in accordance with teachings disclosed herein.

As mentioned above, the second semiconductor material 114 may be grown in many different shapes and/or geometries that may result in different geometries in different structures for the resulting transistors. For example, FIG. 21 is a cross-sectional view of an example transistor 2100 after the growth of the second semiconductor material 114 with a shape generally corresponding to a polygon (e.g., a pentagon) that extends both away from the polarization layer 110 and upwards away from the isolation material 104. The second semiconductor material 114 may be formed in any geometry, and may be formed off of the polarization layer 110 or the first semiconductor material 108 (after removal of the polarization layer 110). In some examples, subsequent processing of the second semiconductor material (e.g., via etching, planarization, etc.) may further adjust the shape of the second semiconductor material 114. In other examples, the shape of the second semiconductor material 114 is retained substantially as it is grown off the first semiconductor material 108 and/or the polarization layer 110.

Figure 22:
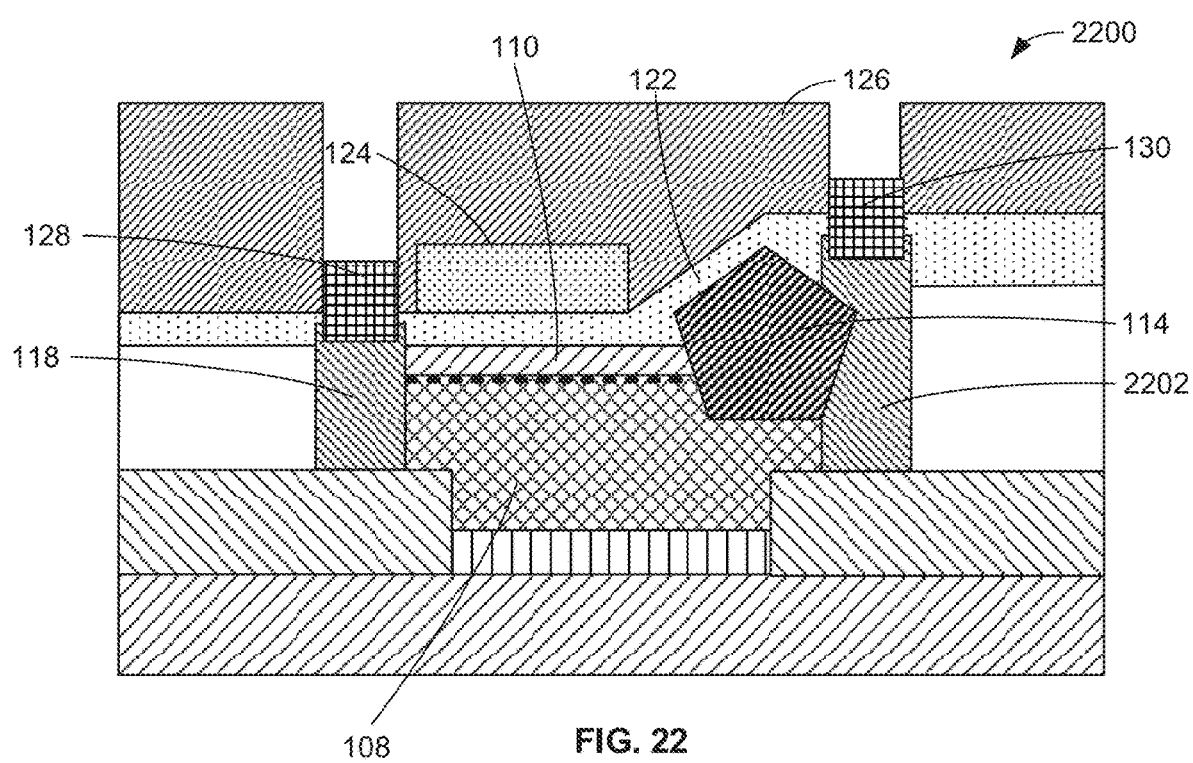
FIG. 22 is a cross-sectional view of another example transistor constructed in accordance with teachings disclosed herein.

FIG. 22 is a cross-sectional view of another example transistor 2200 that includes the second semiconductor material 114 with a shape generally corresponding to a polygonal structure. The crystal facets of the second semiconductor material 114 are determined based on the growth process used to form the second semiconductor material 114. In the illustrated example of FIG. 24, the second semiconductor material 114 is formed on a recessed surface of the first semiconductor material and extends above the top surface of the polarization layer 110. In this examples, the second semiconductor material is not planarized, thereby resulting in the top surface of the second semiconductor material 114 remaining above the first semiconductor material 108 (and the associated polarization layer 110). In some examples, the higher position of the second semiconductor material 114 results in the example drain region 2202 formed adjacent the first semiconductor material 114 extending higher than the source region 118 formed adjacent the first semiconductor material 108. In some examples, the drain region 2202 is formed directly on and in vertical alignment with the second semiconductor material 114. Additionally, in the illustrated example of FIG. 22, the high-k spacer 122 is formed such that it conforms around the second semiconductor material 114, providing electrical isolation between the source region and contact 118, 128, the gate 124, and the drain region and contact 2202, 130. The low-k spacer 126 additionally conforms around the components to provide additional isolation between the different components.

Although several example transistors have been shown and described in FIGS. 1-22, many other variations are possible based on different geometries and structures to position first and second semiconductor materials 108, 114 adjacent one another in series between source and drain regions. Such an arrangement, regardless of the particular geometries involved, enables such transistors to be used in high voltage applications because of the high breakdown voltage of the second semiconductor material while also taking advantage of the high carrier mobility of the first semiconductor material for improved performance.

Figure 23:
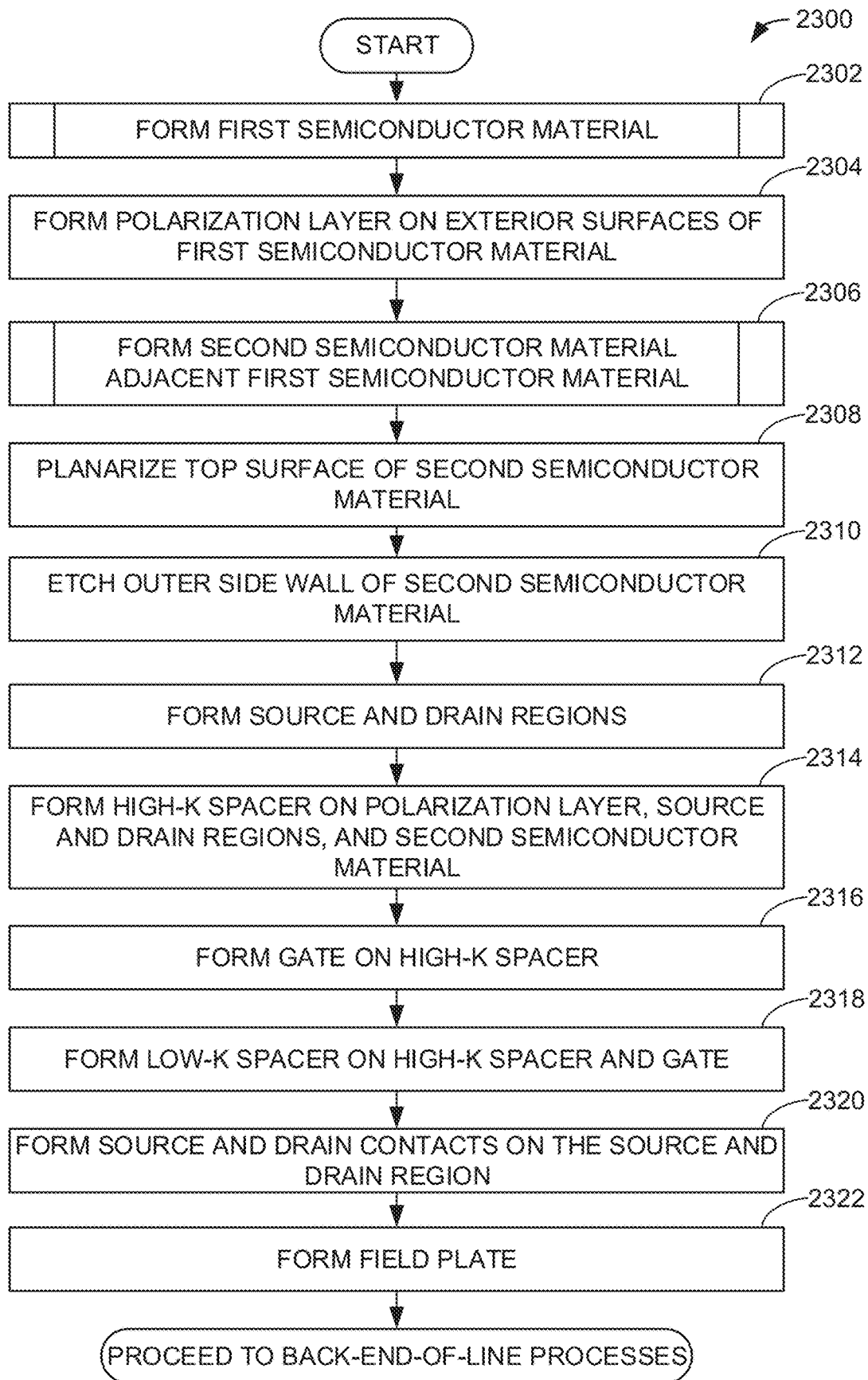
FIGS. 23-26 are flowcharts representative of example methods of manufacturing the example transistors of FIGS. 1-22.

FIG. 23 is a flowchart representative of an example method of manufacturing any one of the example transistors 100, 1000, 1100, 1200, 1600, 1700, 2100, 2200 of FIGS. 1-22. The example method begins at block 2302 by forming a first semiconductor material 108. Further detail regarding the implementation of block 2302 is provided below in connection with FIG. 24. At block 2304, the polarization layer 110 is formed on exterior surfaces of the first semiconductor material 114. In some examples, the polarization layer 110 is formed to cover all exterior (e.g., exposed) surfaces of the first semiconductor material 114. At block 2306, the second semiconductor material 114 is formed adjacent the first semiconductor material 114. Further detail regarding the implementation of block 2306 is provided below in connection with FIGS. 25 and 26.

At block 2308, the top surface of the second semiconductor material 114 is planarized. At block 2310, the outer side wall of the second semiconductor is etched. Blocks 2308, 2310 enable the second semiconductor material to be formed to any suitable shape after the epitaxially growth. For instance, in some examples, the top surface of the second semiconductor material 114 is planarized (at block 2308) to be substantially even with the top surface of the polarization layer 110. In some examples, block 2308 block 2310, or both blocks 2308 and 2310 may be omitted such that the second semiconductor material 114 may extend above the top surface of the first semiconductor material 108 and/or retain its shape resulting from its epitaxially growth.

At block 2312, the source and drain regions 118, 120 are formed. In some examples, the source region 118 is formed adjacent the first semiconductor material 108 and the drain region 120 is formed adjacent the second semiconductor material 114. More particularly, in some examples, the source and drain regions 118, 120 are formed in contact with the first and second semiconductor materials 108, 114, respectively. At block 2314, the high-k spacer 122 is formed on the polarization layer 110, the source and drain regions 118, 120, and the second semiconductor material 114.

At block 2316, the gate 124 is formed on the high-k spacer 122. The example gate 124 may be formed such that it is on a top surface of the high-k spacer 122. Alternatively, the gate 124 may be positioned within an indent formed within the high-k spacer 122. The example gate 124 may positioned such that it is in vertical alignment with the first semiconductor material 108. At block 2318, the low-k spacer 126 is formed on the high-k spacer 122 and the gate 124. At block 2320, the source and drain contacts 128, 130 are formed on the source and drain regions 118, 120. At block 2322, a field plate (e.g., the field plate 1002 of FIG. 10 or the example field plate 1102 of FIG. 11) is formed. In some examples, block 2322 is omitted. Thereafter, the example method of FIG. 23 ends and proceeds to further back-end-of-line processes.

Figure 24:
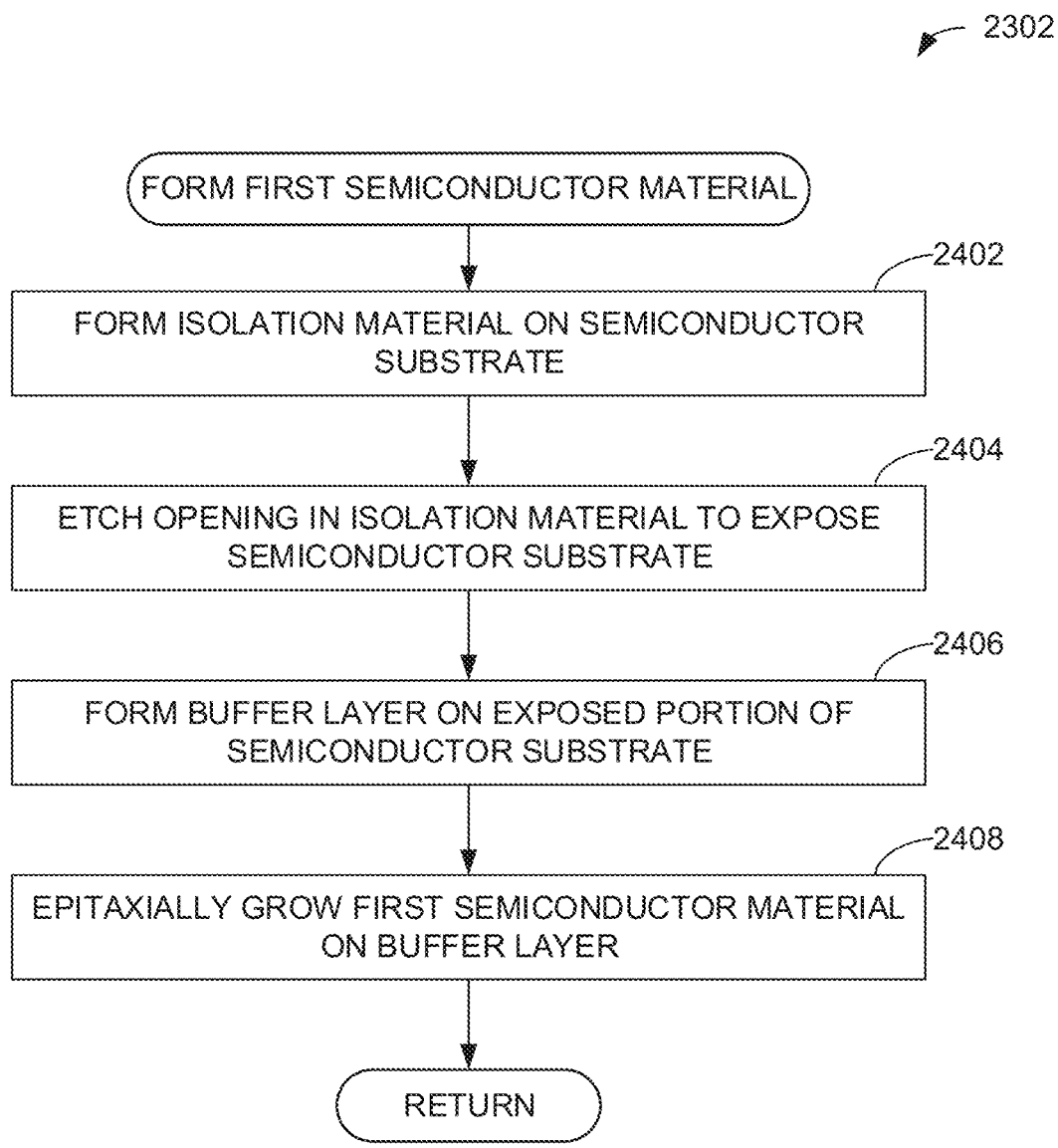

FIG. 24 is a flowchart representative of an example method of implementing block 2302 of FIG. 23 to form the first semiconductor material 114. The example method of FIG. 24 begins at block 2402 with forming an isolation material 104 on the semiconductor substrate 102. At block 2404, an opening 105 is etched in the isolation material 104 to expose the semiconductor substrate 102. In some examples, the opening 105 corresponds to the location where the first semiconductor material 108 is to be epitaxially grown.

At block 2406, the buffer layer 106 is formed on the exposed portion of the semiconductor substrate 102. In some examples, where the first semiconductor material 108 can be formed directly on the semiconductor substrate 102, the buffer layer 106 may be omitted. At block 2408, the first semiconductor material 108 is epitaxially grown on the buffer layer 106. In some examples, the first semiconductor material is laterally overgrown on the top surface of the isolation material 104. In some examples, the epitaxial growth occurs such that the first semiconductor material 108 grows at a constant rate in all directions. In some examples, the growth is controlled such that the first semiconductor material 108 is grown further in one direction than in another direction. Thereafter, the example method of FIG. 24 ends and returns to complete the example method of FIG. 23.

Figure 25:
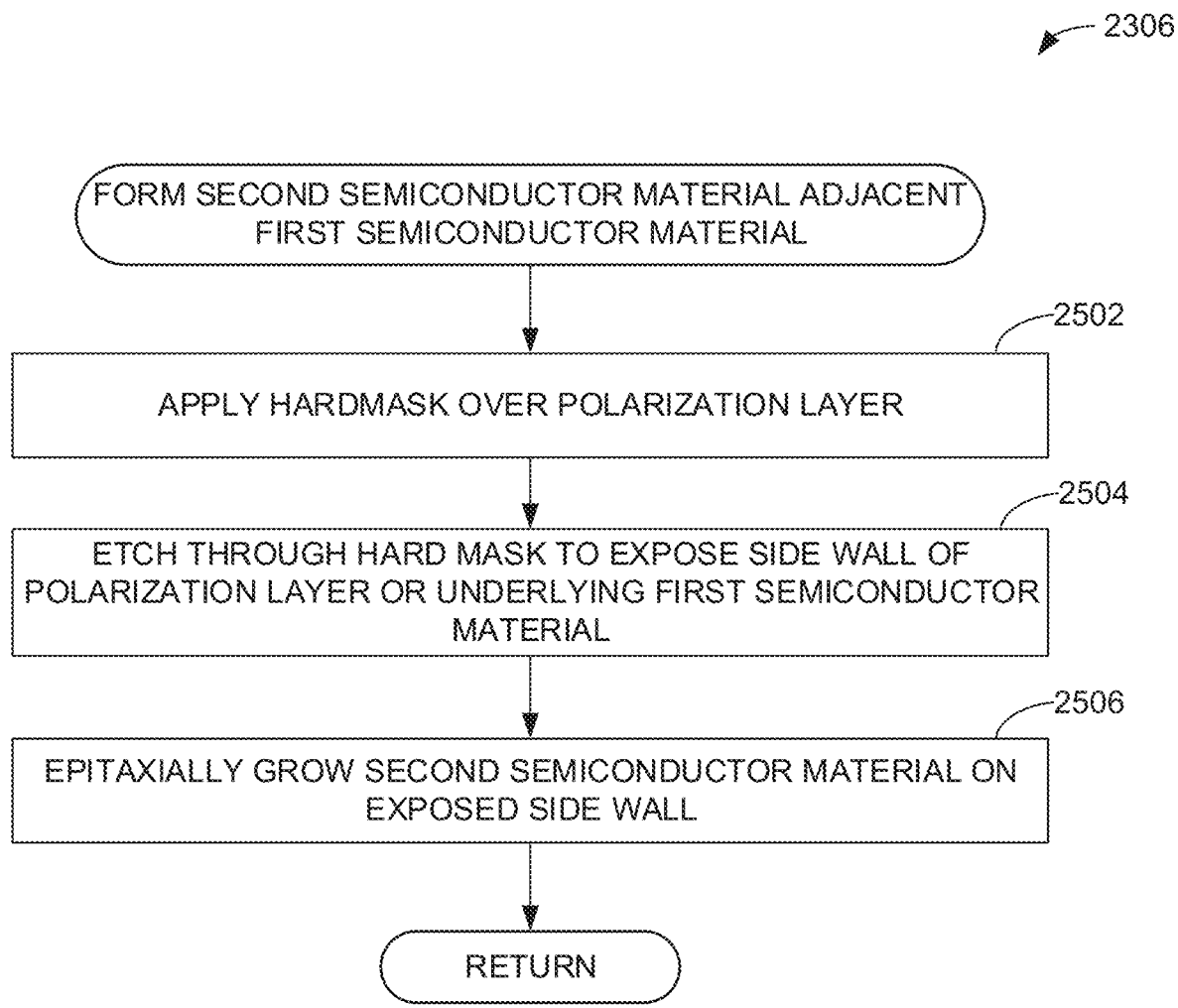

FIG. 25 is a flowchart representative of an example method of implementing block 2306 of FIG. 23 to form the second semiconductor material 114 adjacent the first semiconductor material 108. The example method of FIG. 25 may be suitable to manufacture any one of the example transistors 100, 1000, 1100, 1200, 1600, 2100 of FIGS. 1-16 and FIG. 21. The example method of FIG. 25 begins at block 2502 by applying the hardmask 302 over the polarization layer 110. In some examples, the hardmask 302 may not be necessary due to alternative etching and/or material removal techniques.

At block 2504, the hardmask 302 is etched through to expose a side wall of the polarization layer 110 or the underlying first semiconductor material 108. That is, in some examples, the etching removes the hardmask 302 without removing the polarization layer 110. In other examples, the etching removes both the hardmask 302 and the polarization layer 110 to expose a side wall of the first semiconductor material 108. In some examples, the etching may extend vertically such that the exposed side wall (of either the polarization layer 110 or the first semiconductor material 108) is substantially perpendicular to the semiconductor substrate 102. In some examples, the etching extends through the polarization layer 110 and/or the first semiconductor material to the top surface of the isolation material 104. In some examples, the etching results in an exposed side wall (of either the polarization layer 110 or the first semiconductor material 108) that is angled relative to the vertical direction.

At block 2506, the second semiconductor material 114 is epitaxially grown on the exposed side wall. In some examples, the second semiconductor material 114 is epitaxially grown in a substantially trapezoidal shape, extending both up (vertically) and away (horizontally) from the exposed side wall. The second semiconductor material 114 may be grown in any shape, and off of either one or more exposed side wall(s) of the first semiconductor material 108 and/or off of the polarization layer 110. Thereafter, the example method of FIG. 25 ends and returns to complete the example method of FIG. 23.

Figure 26:
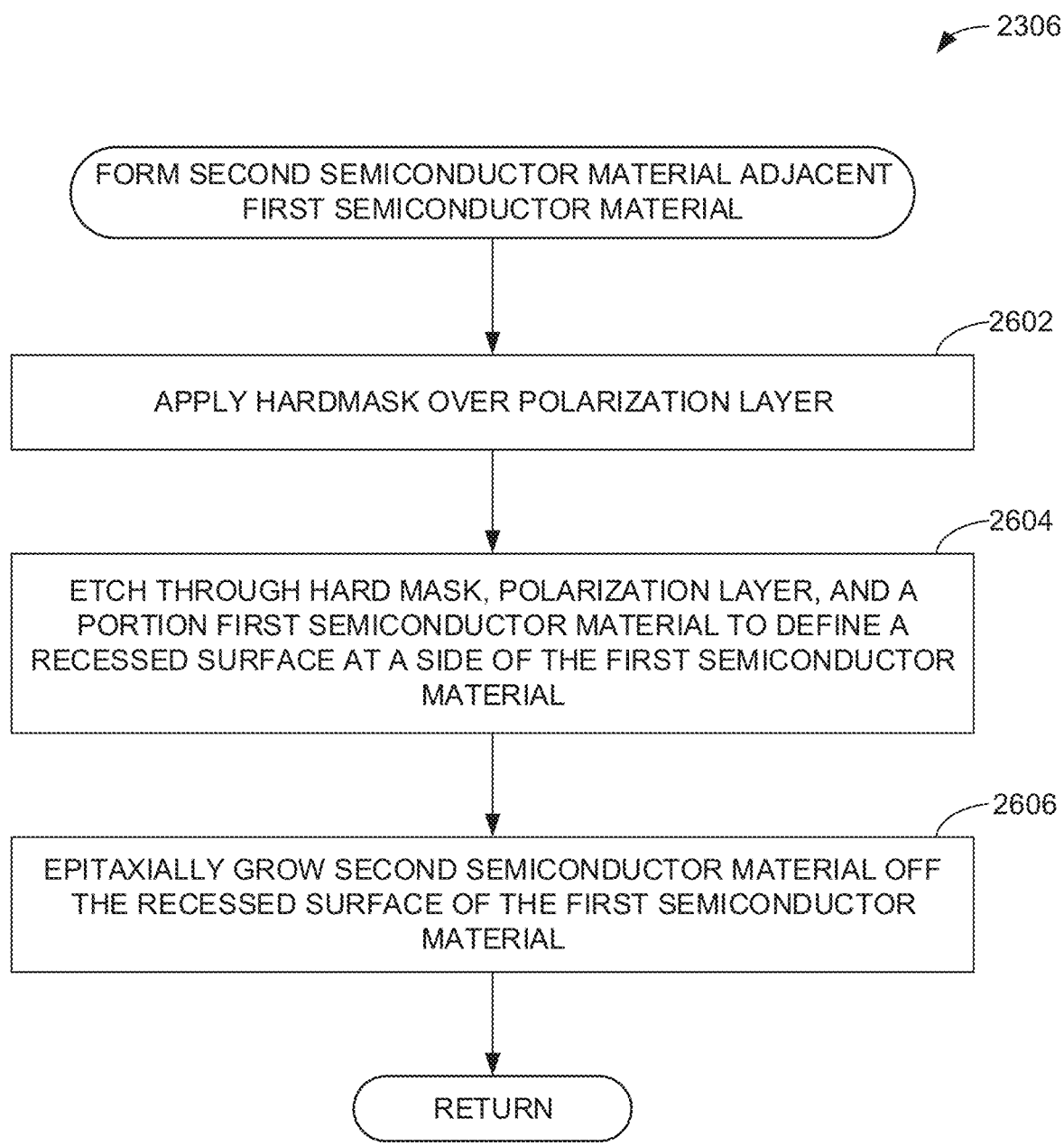

FIG. 26 is a flowchart representative of another example method of implementing block 2306 of FIG. 23 to form the second semiconductor material 114 adjacent the first semiconductor material 108. The example method of FIG. 26 may be suitable to manufacture the example transistors 1700, 2200 of FIGS. 17-20 and 22. The example method begins at block 2602 by applying the hardmask 1708 over the polarization layer 110. At block 2604, the hardmask 1708, the polarization layer 110, and a portion of the first semiconductor material 108 are etched through to define a recessed surface (e.g., the recessed surface 1702 of FIG. 17) at a side of the first semiconductor material 108. In some examples, the recessed surface 1702 is substantially parallel to the semiconductor substrate 102. In some examples, the etched portion of the first semiconductor material 108 defines an inner lateral surface 1704 substantially perpendicular to the semiconductor substrate 102. In some examples, the recessed surface 1702 is above the top surface of the isolation material 104 such that a layer of the first semiconductor material 108 underneath the etched portion remains above the isolation material 104.

At block 2606, the second semiconductor material 114 is epitaxially grown off the recessed surface 1702 of the first semiconductor material 108. Additionally or alternatively, in some examples, the second semiconductor material 114 is grown off the inner lateral surface 1704 associated with the etched portion of the first semiconductor material 108. The second semiconductor material 114 may be grown in any suitable shape and to any suitable extent. Thereafter, the example method of FIG. 26 ends and returns to complete the example method of FIG. 23.

Although example methods are described with reference to the flowcharts illustrated in FIGS. 23-26, many other methods of manufacturing the example transistors 100, 1000, 1100, 1200, 1600, 1700, 2100, 2200 of FIGS. 1-22 in accordance with the teachings disclosed herein may alternatively be used. For example, the order of execution of the blocks may be changed, and/or some of the blocks described may be changed, eliminated, or combined. Similarly, additional operations may be included in the manufacturing process before, in between, or after the blocks shown in FIGS. 23-26.

The transistors 100, 1000, 1100, 1200, 1600, 1700, 2100, 2200 disclosed herein may be included in any suitable electronic component. FIGS. 27-31 illustrate various examples of apparatuses that may include any of the transistors 100, 1000, 1100, 1200, 1600, 1700, 2100, 2200 disclosed herein.

Figure 27:
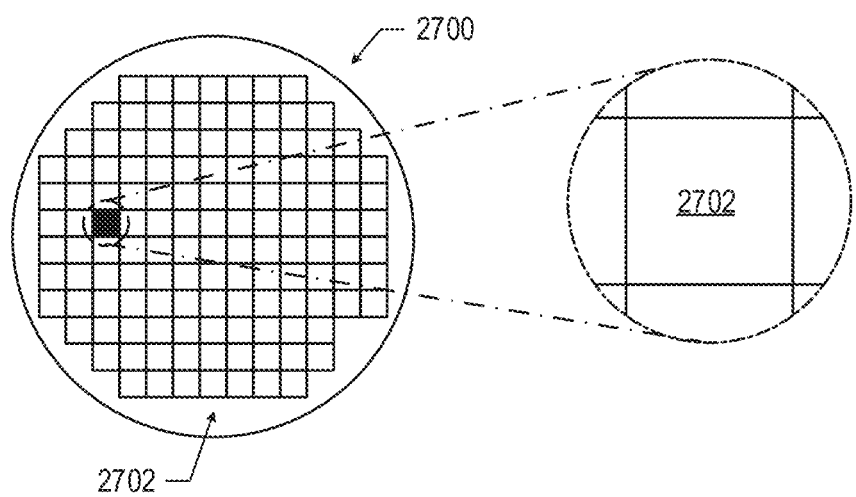
FIG. 27 is a top view of a wafer and dies that may include a transistor, in accordance with any of the examples disclosed herein.

FIG. 27 is a top view of a wafer 2700 and dies 2702 that may include one or more transistors 100, 1000, 1100, 1200, 1600, 1700, 2100, 2200, or may be included in an IC package whose substrate includes one or more transistors 100, 1000, 1100, 1200, 1600, 1700, 2100, 2200 (e.g., as discussed below with reference to FIG. 29) in accordance with any of examples disclosed herein. The wafer 2700 may be composed of semiconductor material and may include one or more dies 2702 having IC structures formed on a surface of the wafer 2700. Each of the dies 2702 may be a repeating unit of a semiconductor product that includes any suitable IC. After the fabrication of the semiconductor product is complete, the wafer 2700 may undergo a singulation process in which the dies 2702 are separated from one another to provide discrete "chips" of the semiconductor product. The die 2702 may include one or more transistors 100, 1000, 1100, 1200, 1600, 1700, 2100, 2200 (e.g., as discussed below with reference to FIG. 28), one or more other transistors (e.g., some of the transistors 2840 of FIG. 28, discussed below) and/or supporting circuitry to route electrical signals to the transistors, as well as any other IC components. In some examples, the wafer 2700 or the die 2702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2702. For example, a memory array formed by multiple memory devices may be formed on a same die 2702 as a processing device (e.g., the processing device 3102 of FIG. 31) or other logic that is configured to store information in the memory devices or execute instructions stored in the memory array.

Figure 28:
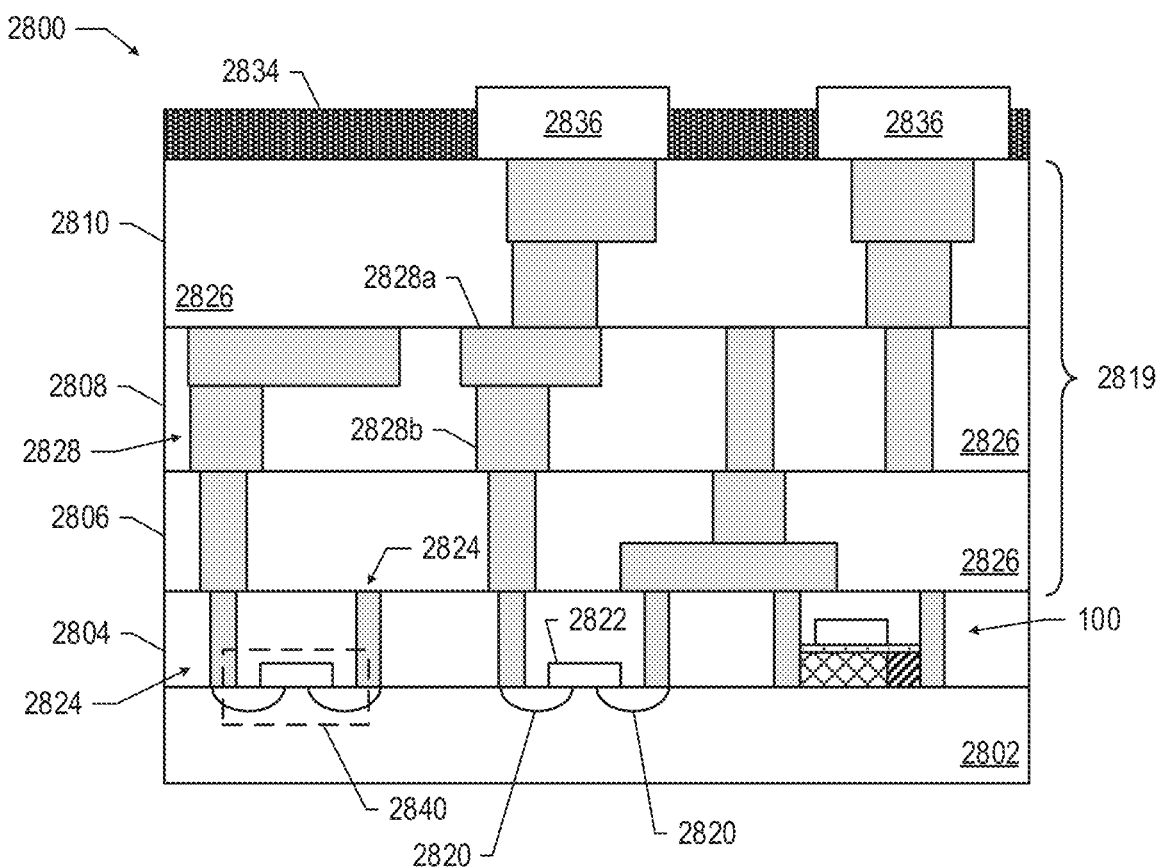
FIG. 28 is a cross-sectional side view of an IC device that may include a transistor, in accordance with any of the examples disclosed herein.

FIG. 28 is a cross-sectional side view of an IC device 2800 that may include one or more transistors 100, 1000, 1100, 1200, 1600, 1700, 2100, 2200, or may be included in an IC package whose substrate includes one or more transistors 100, 1000, 1100, 1200, 1600, 1700, 2100, 2200 (e.g., as discussed below with reference to FIG. 29), in accordance with any of examples disclosed herein. One or more of the IC devices 2800 may be included in one or more dies 2702 (FIG. 27). The IC device 2800 may be formed on a substrate 2802 (e.g., the wafer 2700 of FIG. 27) and may be included in a die (e.g., the die 2702 of FIG. 27). The substrate 2802 may be a semiconductor substrate composed of semiconductor material systems including, for example, n-type or p-type materials systems (or a combination of both). The substrate 2802 may include, for example, a crystalline substrate formed using a bulk silicon or a silicon-on-insulator (SOI) substructure. In some examples, the substrate 2802 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2802. Although a few examples of materials from which the substrate 2802 may be formed are described here, any material that may serve as a foundation for an IC device 2800 may be used. The substrate 2802 may be part of a singulated die (e.g., the dies 2702 of FIG. 27) or a wafer (e.g., the wafer 2700 of FIG. 27).

The IC device 2800 may include one or more device layers 2804 disposed on the substrate 2802. The device layer 2804 may include features of one or more transistors 2840 (e.g., metal oxide semiconductor field-effect transistors (MOSFETs)) formed on the substrate 2802. The device layer 2804 may include, for example, one or more source and/or drain (S/D) regions 2820, a gate 2822 to control current flow in the transistors 2840 between the S/D regions 2820, and one or more S/D contacts 2824 to route electrical signals to/from the S/D regions 2820. The transistors 2840 may include additional features not depicted for the sake of clarity, such as device isolation regions, gate contacts, and the like. The transistors 2840 are not limited to the type and configuration depicted in FIG. 28 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2840 may include a gate 2822 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2840 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2820 may be formed within the substrate 2802 adjacent to the gate 2822 of each transistor 2840. The S/D regions 2820 may be formed using an implantation/diffusion process or an etching/deposition process, for example. In the former process, dopants such as boron, aluminum, antimony, phosphorous, or arsenic may be ion-implanted into the substrate 2802 to form the S/D regions 2820. An annealing process that activates the dopants and causes them to diffuse farther into the substrate 2802 may follow the ion-implantation process. In the latter process, the substrate 2802 may first be etched to form recesses at the locations of the S/D regions 2820. An epitaxial deposition process may then be carried out to fill the recesses with material that is used to fabricate the S/D regions 2820. In some implementations, the S/D regions 2820 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2820 may be formed using one or more alternate semiconductor materials such as germanium or a group III-V material or alloy. In further examples, one or more layers of metal and/or metal alloys may be used to form the S/D regions 2820.

In some examples, the device layer 2804 may include one or more transistors 100, 1000, 1100, 1200, 1600, 1700, 2100, 2200, in addition to or instead of transistors 2840. FIG. 28 illustrates a single example transistor 100 in the device layer 2804 for illustration purposes, but any number and structure of transistors 100, 1000, 1100, 1200, 1600, 1700, 2100, 2200 may be included in a device layer 2804. A transistor 100, 1000, 1100, 1200, 1600, 1700, 2100, 2200 included in a device layer 2804 may be referred to as a "front end" device. In some examples, the IC device 2800 may not include any front end transistors 100, 1000, 1100, 1200, 1600, 1700, 2100, 2200. One or more transistors 100, 1000, 1100, 1200, 1600, 1700, 2100, 2200 in the device layer 2804 may be coupled to any suitable other ones of the devices in the device layer 2804, to any devices in the metallization stack 2819 (discussed below), and/or to one or more of the conductive contacts 2836 (discussed below).

Electrical signals, such as power and/or input/output (I/O) signals, may be routed to and/or from the devices (e.g., transistors 2840 and/or transistors 100, 1000, 1100, 1200, 1600, 1700, 2100, 2200) of the device layer 2804 through one or more interconnect layers disposed on the device layer 2804 (illustrated in FIG. 28 as interconnect layers 2806-2810). For example, electrically conductive features of the device layer 2804 (e.g., the gate 2822 and the S/D contacts 2824) may be electrically coupled with the interconnect structures 2828 of the interconnect layers 2806-2810. The one or more interconnect layers 2806-2810 may form a metallization stack (also referred to as an "ILD stack") 2819 of the IC device 2800. In some examples, one or more transistors 100, 1000, 1100, 1200, 1600, 1700, 2100), 2200 may be disposed in one or more of the interconnect layers 2806-2810, in accordance with any of the techniques disclosed herein. In some examples, any number and structure of transistors 100, 1000, 1100, 1200, 1600, 1700, 2100, 2200 may be included in any one or more of the layers in a metallization stack 2819. A transistor 100, 1000, 1100, 1200, 1600, 1700, 2100, 2200 included in the metallization stack 2819 may be referred to as a "back-end" device. In some examples, the IC device 2800 may not include any back-end transistors 100, 1000, 1100, 1200, 1600, 1700, 2100, 2200; in some examples, the 2800 may include both front- and back-end transistors 100, 1000, 1100, 1200, 1600, 1700, 2100, 2200. One or more transistors 100, 1000, 1100, 1200, 1600, 1700, 2100, 2200 in the metallization stack 2819 may be coupled to any suitable ones of the devices in the device layer 2804, and/or to one or more of the conductive contacts 2836 (discussed below).

The interconnect structures 2828 may be arranged within the interconnect layers 2806-2810 to route electrical signals according to a wide variety of designs (in particular, the arrangement is not limited to the particular configuration of interconnect structures 2828 depicted in FIG. 28). Although a particular number of interconnect layers 2806-2810 is depicted in FIG. 28, examples of the present disclosure include IC devices having more or fewer interconnect layers than depicted.

In some examples, the interconnect structures 2828 may include lines 2828a and/or vias 2828b filled with an electrically conductive material such as a metal. The lines 2828a may be arranged to route electrical signals in a direction of a plane that is substantially parallel with a surface of the substrate 2802 upon which the device layer 2804 is formed. For example, the lines 2828a may route electrical signals in a direction in and out of the page from the perspective of FIG. 28. The vias 2828b may be arranged to route electrical signals in a direction of a plane that is substantially perpendicular to the surface of the substrate 2802 upon which the device layer 2804 is formed. In some examples, the vias 2828b may electrically couple lines 2828a of different interconnect layers 2806-2810 together.

The interconnect layers 2806-2810 may include a dielectric material 2826 disposed between the interconnect structures 2828, as shown in FIG. 28. In some examples, the dielectric material 2826 disposed between the interconnect structures 2828 in different ones of the interconnect layers 2806-1610 may have different compositions; in other examples, the composition of the dielectric material 2826 between different interconnect layers 2806-1610 may be the same.

A first interconnect layer 2806 (referred to as Metal 1 or "M1") may be formed directly on the device layer 2804. In some examples, the first interconnect layer 2806 may include lines 2828a and/or vias 2828b, as shown. The lines 2828a of the first interconnect layer 2806 may be coupled with contacts (e.g., the S/D contacts 2824) of the device layer 2804.

A second interconnect layer 2808 (referred to as Metal 2 or "M2") may be formed directly on the first interconnect layer 2806. In some examples, the second interconnect layer 2808 may include vias 2828b to couple the lines 2828a of the second interconnect layer 2808 with the lines 2828a of the first interconnect layer 2806. Although the lines 2828a and the vias 2828b are structurally delineated with a line within each interconnect layer (e.g., within the second interconnect layer 2808) for the sake of clarity, the lines 2828a and the vias 2828b may be structurally and/or materially contiguous (e.g., simultaneously filled during a dual-damascene process) in some examples.

A third interconnect layer 1610 (referred to as Metal 3 or "M3") (and additional interconnect layers, as desired) may be formed in succession on the second interconnect layer 2808 according to similar techniques and configurations described in connection with the second interconnect layer 2808 or the first interconnect layer 2806. In some examples, the interconnect layers that are "higher up" in the metallization stack 2819 in the IC device 2800 (i.e., further away from the device layer 2804) may be thicker.

The IC device 2800 may include a solder resist material 2834 (e.g., polyimide or similar material) and one or more conductive contacts 2836 formed on the interconnect layers 2806-1610. In FIG. 28, the conductive contacts 2836 are illustrated as taking the form of bond pads. The conductive contacts 2836 may be electrically coupled with the interconnect structures 2828 and configured to route the electrical signals of the transistor(s) 2840 to other external devices. For example, solder bonds may be formed on the one or more conductive contacts 2836 to mechanically and/or electrically couple a chip including the IC device 2800 with another component (e.g., a circuit board). The IC device 2800 may include additional or alternate structures to route the electrical signals from the interconnect layers 2806-1610; for example, the conductive contacts 2836 may include other analogous features (e.g., posts) that route the electrical signals to external components.

Figure 29:
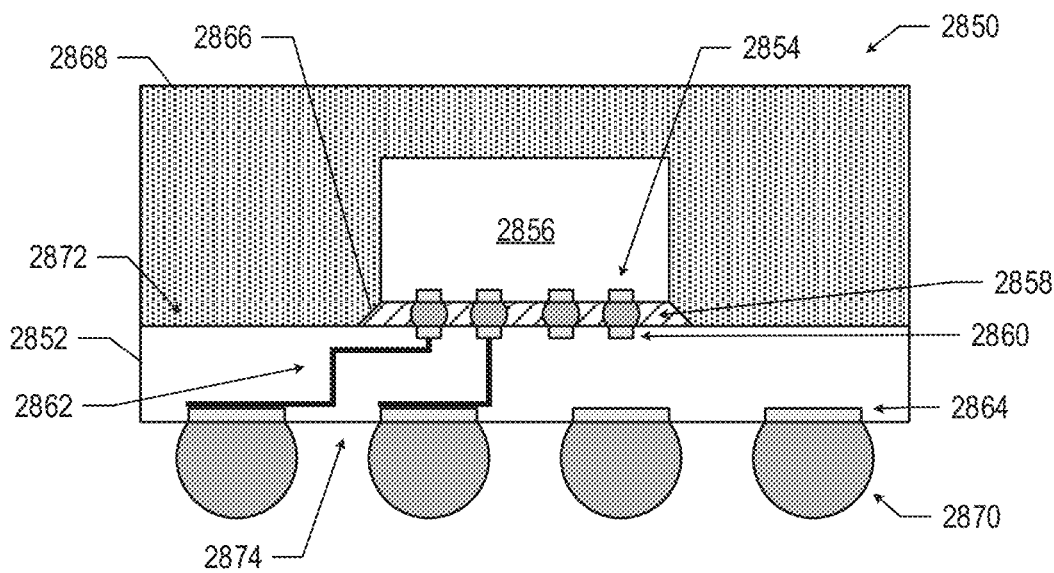
FIG. 29 is a cross-sectional side view of an IC package that may include a transistor, in accordance with various examples.

FIG. 29 is a cross-sectional view of an example IC package 2850 that may include one or more transistors 100, 1000, 1100, 1200, 1600, 1700, 2100, 2200. The package substrate 2852 may be formed of a dielectric material, and may have conductive pathways extending through the dielectric material between the face 2872 and the face 2874, or between different locations on the 2872, and/or between different locations on the face 2874. These conductive pathways may take the form of any of the interconnects 2828 discussed above with reference to FIG. 28. In some examples, any number of transistors 100, 1000, 1100, 1200, 1600, 1700, 2100, 2200 (with any suitable structure) may be included in a package substrate 2852. In some examples, no transistors 100, 1000, 1100, 1200, 1600, 1700, 2100, 2200 may be included in the package substrate 2852.

The IC package 2850 may include a die 2856 coupled to the package substrate 2852 via conductive contacts 2854 of the die 2856, first-level interconnects 2858, and conductive contacts 2860 of the package substrate 2852. The conductive contacts 2860 may be coupled to conductive pathways 2862 through the package substrate 2852, allowing circuitry within the die 2856 to electrically couple to various ones of the conductive contacts 2864 or to the transistors 100, 1000, 100, 1200, 1600, 1700, 2100, 2200) (or to other devices included in the package substrate 2852, not shown). The first-level interconnects 2858 illustrated in FIG. 29 are solder bumps, but any suitable first-level interconnects 2858 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 2866 may be disposed between the die 2856 and the package substrate 2852 around the first-level interconnects 2858, and a mold compound 2868 may be disposed around the die 2856 and in contact with the package substrate 2852. In some examples, the underfill material 2866 may be the same as the mold compound 2868. Example materials that may be used for the underfill material 2866 and the mold compound 2868 are epoxy mold materials, as suitable. Second-level interconnects 2870 may be coupled to the conductive contacts 2864. The second-level interconnects 2870 illustrated in FIG. 29 are solder balls (e.g., for a ball grid array arrangement), but any suitable second-level interconnects 16770 may be used (e.g., pins in a pin grid array arrangement or lands in a land grid array arrangement). The second-level interconnects 2870 may be used to couple the IC package 2850 to another component, such as a circuit board (e.g., a motherboard), an interposer, or another IC package, as known in the art and as discussed below with reference to FIG. 30.

In FIG. 29, the IC package 2850 is a flip chip package, and includes a transistor 100, 1000, 1100, 1200, 1600, 1700, 2100, 2200 in the package substrate 2852. Any number of transistors 100, 1000, 1100, 1200, 1600, 1700, 2100, 2200 (with any suitable structure) may be included in a package substrate 2852. In some examples, no transistors 100, 1000, 1100, 1200, 1600, 1700, 2100, 2200 may be included in the package substrate 2852. The die 2856 may take the form of any of the examples of the die 2702 discussed herein (e.g., may include any of the examples of the IC device 2800). In some examples, the die 2856 may include one or more transistors 100, 1000, 1100, 1200, 1600, 1700, 2100, 2200 (e.g., as discussed above with reference to FIG. 27 and FIG. 28); in other examples, the die 2856 may not include any transistors 100, 1000, 1100, 1200, 1600, 1700, 2100, 2200.

Although the IC package 2850 illustrated in FIG. 29 is a flip chip package, other package architectures may be used. For example, the IC package 2850 may be a ball grid array (BGA) package, such as an embedded wafer-level ball grid array (eWLB) package. In another example, the IC package 2850 may be a wafer-level chip scale package (WLCSP) or a panel fanout (FO) package. Although a single die 2856 is illustrated in the IC package 2850 of FIG. 29, an IC package 2850 may include multiple dies 2856 (e.g., with one or more of the multiple dies 2856 coupled to transistors 100, 1000, 1100, 1200, 1600, 1700, 2100, 2200 included in the package substrate 2852). An IC package 2850 may include additional passive components, such as surface-mount resistors, capacitors, and inductors disposed on the first face 2872 or the second face 2874 of the package substrate 2852. More generally, an IC package 2850 may include any other active or passive components known in the art.

Figure 30:
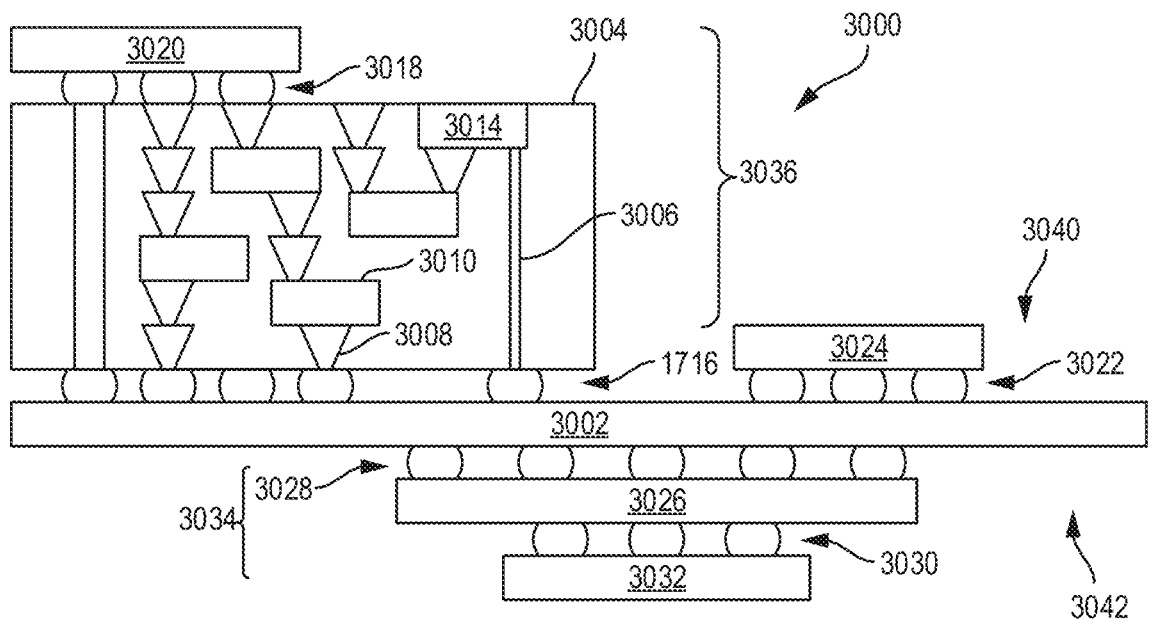
FIG. 30 is a cross-sectional side view of an IC device assembly that may include a transistor, in accordance with any of the examples disclosed herein.

FIG. 30 is a cross-sectional side view of an IC device assembly 3000 that may include one or more IC packages or other electronic components (e.g., a die) including one or more transistors 100, 1000, 1100, 1200), 1600, 1700, 2100, 2200, in accordance with any of the examples disclosed herein. The IC device assembly 3000 includes a number of components disposed on a circuit board 3002 (which may be, e.g., a motherboard). The IC device assembly 3000 includes components disposed on a first face 3040 of the circuit board 3002 and an opposing second face 3042 of the circuit board 3002; generally, components may be disposed on one or both faces 3040 and 3042. Any of the IC packages discussed below with reference to the IC device assembly 3000 may take the form of any of the examples of the IC package 2850 discussed above with reference to FIG. 29 (e.g., may include one or more transistors 100, 1000, 1100, 1200, 1600, 1700, 2100, 2200 in a package substrate 2852 or in a die).

In some examples, the circuit board 3002 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 3002. In other examples, the circuit board 3002 may be a non-PCB substrate.

The IC device assembly 3000 illustrated in FIG. 30 includes a package-on-interposer structure 3036 coupled to the first face 3040 of the circuit board 3002 by coupling components 3016. The coupling components 3016 may electrically and mechanically couple the package-on-interposer structure 3036 to the circuit board 3002, and may include solder balls (as shown in FIG. 30), male and female portions of a socket, an adhesive, an underfill material, and/or any other suitable electrical and/or mechanical coupling structure.

The package-on-interposer structure 3036 may include an IC package 3020 coupled to an interposer 3004 by coupling components 3018. The coupling components 3018 may take any suitable form for the application, such as the forms discussed above with reference to the coupling components 3016. Although a single IC package 3020 is shown in FIG. 30, multiple IC packages may be coupled to the interposer 3004; indeed, additional interposers may be coupled to the interposer 3004. The interposer 3004 may provide an intervening substrate used to bridge the circuit board 3002 and the IC package 3020. The IC package 3020 may be or include, for example, a die (the die 2702 of FIG. 27), an IC device (e.g., the IC device 2800 of FIG. 28), or any other suitable component. Generally, the interposer 3004 may spread a connection to a wider pitch or reroute a connection to a different connection. For example, the interposer 3004 may couple the IC package 3020 (e.g., a die) to a set of BGA conductive contacts of the coupling components 3016 for coupling to the circuit board 3002. In the example illustrated in FIG. 30, the IC package 3020 and the circuit board 3002 are attached to opposing sides of the interposer 3004; in other examples, the IC package 3020 and the circuit board 3002 may be attached to a same side of the interposer 3004. In some examples, three or more components may be interconnected by way of the interposer 3004.

The interposer 3004 may be formed of an epoxy resin, a fiberglass-reinforced epoxy resin, an epoxy resin with inorganic fillers, a ceramic material, or a polymer material such as polyimide. In some examples, the interposer 3004 may be formed of alternate rigid or flexible materials that may include the same materials described above for use in a semiconductor substrate, such as silicon, germanium, and other group III-V and group IV materials. The interposer 3004 may include metal vias 3008 and interconnects 3010, including but not limited to through-silicon vias (TSVs) 3006. The interposer 3004 may further include embedded devices 3014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 3004. The package-on-interposer structure 3036 may take the form of any of the package-on-interposer structures known in the art. In some examples, the interposer 3004 may include one or more transistors 100, 1000, 1100, 1200, 1600, 1700, 2100, 2200.

The IC device assembly 3000 may include an IC package 3024 coupled to the first face 3040 of the circuit board 3002 by coupling components 3022. The coupling components 3022 may take the form of any of the examples discussed above with reference to the coupling components 3016, and the IC package 3024 may take the form of any of the examples discussed above with reference to the IC package 3020.

The IC device assembly 3000 illustrated in FIG. 30 includes a package-on-package structure 3034 coupled to the second face 3042 of the circuit board 3002 by coupling components 3028. The package-on-package structure 3034 may include an IC package 3026 and an IC package 3032 coupled together by coupling components 3030 such that the IC package 3026 is disposed between the circuit board 3002 and the IC package 3032. The coupling components 3028 and 3030 may take the form of any of the examples of the coupling components 3016 discussed above, and the IC packages 3026 and 3032 may take the form of any of the examples of the IC package 3020 discussed above. The package-on-package structure 3034 may be configured in accordance with any of the package-on-package structures known in the art.

Figure 31:
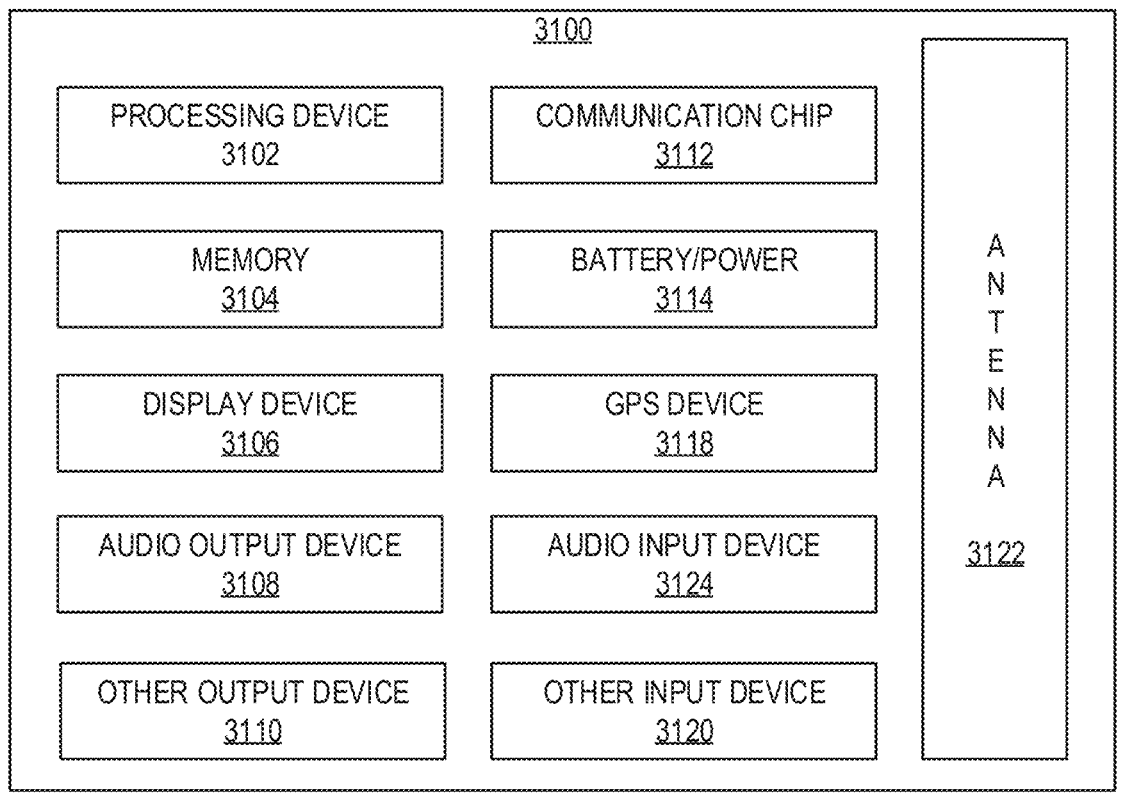
FIG. 31 is a block diagram of an example electrical device that may include a transistor, in accordance with any of the examples disclosed herein.

FIG. 31 is a block diagram of an example electrical device 3100 that may include one or more transistors 100, 1000, 1100, 1200, 1600, 1700, 2100, 2200, in accordance with any of the examples disclosed herein. For example, any suitable ones of the components of the electrical device 3100 may include one or more of the IC packages 2850, IC devices 1600, or dies 2702 disclosed herein. A number of components are illustrated in FIG. 31 as included in the electrical device 3100, but any one or more of these components may be omitted or duplicated, as suitable for the application. In some examples, some or all of the components included in the electrical device 3100 may be attached to one or more motherboards. In some examples, some or all of these components are fabricated onto a single system-on-a-chip (SoC) die.

Additionally, in various examples, the electrical device 3100 may not include one or more of the components illustrated in FIG. 31, but the electrical device 3100 may include interface circuitry for coupling to the one or more components. For example, the electrical device 3100 may not include a display device 3106, but may include display device interface circuitry (e.g., a connector and driver circuitry) to which a display device 3106 may be coupled. In another set of examples, the electrical device 3100 may not include an audio input device 3124 or an audio output device 3108, but may include audio input or output device interface circuitry (e.g., connectors and supporting circuitry) to which an audio input device 3124 or audio output device 3108 may be coupled.

The electrical device 3100 may include a processing device 3102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 3102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 3100 may include a memory 3104, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 3104 may include memory that shares a die with the processing device 3102. This memory may be used as cache memory and may include embedded dynamic random access memory (eDRAM) or spin transfer torque magnetic random access memory (STT-MRAM).

In some examples, the electrical device 3100 may include a communication chip 3112 (e.g., one or more communication chips). For example, the communication chip 3112 may be configured for managing wireless communications for the transfer of data to and from the electrical device 3100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 3112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 3112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 3112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 3112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 3112 may operate in accordance with other wireless protocols in other examples. The electrical device 3100 may include an antenna 3122 to facilitate wireless communications and/or to receive other wireless communications (such as AM or FM radio transmissions).

In some examples, the communication chip 3112 may manage wired communications, such as electrical, optical, or any other suitable communication protocols (e.g., the Ethernet). As noted above, the communication chip 3112 may include multiple communication chips. For instance, a first communication chip 3112 may be dedicated to shorter-range wireless communications such as Wi-Fi or Bluetooth, and a second communication chip 3112 may be dedicated to longer-range wireless communications such as global positioning system (GPS), EDGE, GPRS, CDMA, WiMAX, LTE, EV-DO, or others. In some examples, a first communication chip 3112 may be dedicated to wireless communications, and a second communication chip 3112 may be dedicated to wired communications.

The electrical device 3100 may include battery/power circuitry 3114. The battery/power circuitry 3114 may include one or more energy storage devices (e.g., batteries or capacitors) and/or circuitry for coupling components of the electrical device 3100 to an energy source separate from the electrical device 3100 (e.g., AC line power).

The electrical device 3100 may include a display device 3106 (or corresponding interface circuitry, as discussed above). The display device 3106 may include any visual indicators, such as a heads-up display, a computer monitor, a projector, a touchscreen display, a liquid crystal display (LCD), a light-emitting diode display, or a flat panel display.

The electrical device 3100 may include an audio output device 3108 (or corresponding interface circuitry, as discussed above). The audio output device 3108 may include any device that generates an audible indicator, such as speakers, headsets, or earbuds.

The electrical device 3100 may include an audio input device 3124 (or corresponding interface circuitry, as discussed above). The audio input device 3124 may include any device that generates a signal representative of a sound, such as microphones, microphone arrays, or digital instruments (e.g., instruments having a musical instrument digital interface (MIDI) output).

The electrical device 3100 may include a GPS device 3118 (or corresponding interface circuitry, as discussed above). The GPS device 3118 may be in communication with a satellite-based system and may receive a location of the electrical device 3100, as known in the art.

The electrical device 3100 may include an other output device 3110 (or corresponding interface circuitry, as discussed above). Examples of the other output device 3110 may include an audio codec, a video codec, a printer, a wired or wireless transmitter for providing information to other devices, or an additional storage device.

The electrical device 3100 may include an other input device 3120 (or corresponding interface circuitry, as discussed above). Examples of the other input device 3120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 3100 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 3100 may be any other electronic device that processes data.

The following paragraphs provide various examples of the examples disclosed herein.

From the foregoing, it will be appreciated that example methods, apparatus and articles of manufacture have been disclosed that enable the fabrication of a transistor with a first semiconductor material and a second semiconductor material between the source and the drain. In some examples, the first semiconductor material has a higher carrier mobility than the second semiconductor material and the first semiconductor material has a lower band gap than the second semiconductor material. In such examples, the transistor is capable of having a high breakdown voltage because of the second semiconductor material without sacrificing performance because of the high carrier mobility of the first semiconductor material.

Example 1 includes a transistor comprising a first semiconductor material, a second semiconductor material adjacent the first semiconductor material, a source proximate the first semiconductor material and spaced apart from the second semiconductor material, a drain proximate the second semiconductor material and spaced apart from the first semiconductor material, and a gate located between the source and the drain.

Example 2 includes the transistor of example 1, wherein the first and second semiconductor materials define respective first and second portions of a path for current to flow between the source and the drain.

Example 3 includes the transistor of example 2, wherein the gate, when energized, is to activate a controlled channel at an interface between a top surface of the first semiconductor material and a polarization layer between the first semiconductor material and the gate, the controlled channel corresponding to the first portion of the path.

Example 4 includes the transistor of example 1, further including a polarization layer between the first semiconductor material and the gate.

Example 5 includes the transistor of example 4, wherein a top surface of the polarization layer is substantially coplanar with a top surface of the second semiconductor material.

Example 6 includes the transistor of example 4, wherein the polarization layer extends along a side wall of the first semiconductor material, the second semiconductor material being in contact with the polarization layer along the side wall.

Example 7 includes the transistor of example 6, wherein a lateral side of the gate substantially aligns with the side wall of the first semiconductor material, the side wall proximate the second semiconductor material.

Example 8 includes the transistor of any one of examples 1-7, wherein the gate is in vertical alignment with the first semiconductor material and is laterally offset relative to the second semiconductor material.

Example 9 includes the transistor of any one of examples 1-7, wherein the gate is closer to the source than to the drain.

Example 10 includes the transistor of any one of examples 1-7, further including a high-k spacer between the first semiconductor material and the gate, the high-k spacer extending between the source and the drain.

Example 11 includes the transistor of example 10, further including a low-k spacer on the high-k spacer, the low-k spacer extending between the gate and the source and between the gate and the drain.

Example 12 includes the transistor of any one of examples 1-6, further including a semiconductor substrate, and an isolation material on the semiconductor substrate, the isolation material positioned between the second semiconductor material and the semiconductor substrate, the isolation material not between a portion of the first semiconductor material and the semiconductor substrate.

Example 13 includes the transistor of any one of examples 1-7, wherein a first top surface of the first semiconductor material is lower than a second top surface of the second semiconductor material.

Example 14 includes the transistor of any one of examples 1-7, wherein the second semiconductor material is in contact with a recessed surface of the first semiconductor material, the recessed surface being substantially parallel to a top surface of the first semiconductor material, the second semiconductor material being in contact with an inner lateral surface of the first semiconductor material, the inner lateral surface being substantially perpendicular to the top surface of the first semiconductor material.

Example 15 includes the transistor of any one of examples 1-7, wherein the first semiconductor material extends under the second semiconductor material.

Example 16 includes the transistor of any one of examples 1-7, further including a field plate positioned in vertical alignment with the gate, the field plate electrically connected to the gate.

Example 17 includes the transistor of any one of examples 1-7, further including a field plate indirectly connected to the gate via a metal interconnect.

Example 18 includes the transistor of any one of examples 1-7, wherein the first semiconductor material has a first carrier mobility that is greater than a second carrier mobility of the second semiconductor material.

Example 19 includes the transistor of any one of examples 1-7, wherein the first semiconductor material has a first band gap and the second semiconductor material has a second band gap, the second band gap being wider than the first band gap.

Example 20 includes the transistor of any one of examples 1-7, wherein a distance between the gate and the drain corresponds to a length of the second semiconductor material in a direction extending between the source and the drain.

Example 21 includes the transistor of any one of examples 1-7, wherein the first semiconductor material includes gallium and nitrogen.

Example 22 includes the transistor of any one of examples 1-7, wherein the second semiconductor material includes gallium, and oxygen.

Example 23 includes the transistor of example 22, wherein the second semiconductor material is doped with tin.

Example 24 includes an integrated circuit comprising a source region, a drain region spaced apart from the source region, a first semiconductor material, a second semiconductor material positioned laterally in series with the first semiconductor material between the source region and the drain region, and a gate positioned between the source region and the drain region.

Example 25 includes the integrated circuit of example 24, further including a polarization layer extending between the first semiconductor material and the second semiconductor material.

Example 26 includes the integrated circuit of example 24, wherein the first semiconductor material and the second semiconductor material are in contact.

Example 27 includes the integrated circuit of example 24, wherein a top surface of the second semiconductor material extends above a top surface of the first semiconductor material.

Example 28 includes the integrated circuit of example 24, wherein a portion of the first semiconductor material is positioned underneath the second semiconductor material.

Example 29 includes the integrated circuit of any one of examples 24-28, wherein the first semiconductor material and the second semiconductor material define a channel, the channel enabling current flow between the source region and the drain region.

Example 30 includes the integrated circuit of example 29, further including a polarization layer extending above the first semiconductor material, an interface between the polarization layer and the first semiconductor material associated with a controlled portion of the channel, the controlled portion of the channel to be controlled by the gate.

Example 31 includes the integrated circuit of any one of examples 24-28, wherein an entire length of the gate is positioned directly above the first semiconductor material and laterally between opposite ends of a length of the first semiconductor material.

Example 32 includes the integrated circuit of example 31, wherein a side of the gate is substantially coplanar with a side of the first semiconductor material, the side of the first semiconductor material facing the second semiconductor material.

Example 33 includes the integrated circuit of any one of examples 24-28, further including a field plate connected to the gate and extending above the gate.

Example 34 includes the integrated circuit of any one of examples 24-28, further including a field plate vertically spaced apart from the gate.

Example 35 includes a system comprising a processor circuit, and a transistor including a first semiconductor material, a second semiconductor material adjacent the first semiconductor material, a source adjacent the first semiconductor material, a drain adjacent the second semiconductor material, the source, the first semiconductor material, the second semiconductor material, and the drain positioned electrically in series, and a gate located between the source and the drain.

Example 36 includes the system of example 35, wherein the first and second semiconductor materials define respective first and second portions of an electrical path for current to flow between the source and the drain.

Example 37 includes the system of example 35, wherein the transistor further includes a polarization layer between the first semiconductor material and the gate.

Example 38 includes the system of example 37, wherein the gate, when energized, is to activate a controlled channel at an interface between a top surface of the first semiconductor material and the polarization layer between the first semiconductor material and the gate.

Example 39 includes the system of example 38, wherein a top surface of the polarization layer is substantially coplanar with a top surface of the second semiconductor material.

Example 40 includes the system of example 38, wherein the polarization layer separates the first semiconductor material from the second semiconductor material along a side wall of the first semiconductor material.

Example 41 includes the system of example 40, wherein a lateral side of the gate facing the drain substantially aligns with the side wall of the first semiconductor material.

Example 42 includes the system of any one of examples 35-41, wherein a length of the gate overlaps a length of the first semiconductor material, the length of the gate being laterally offset relative to a length of the second semiconductor material.

Example 43 includes the system of any one of examples 35-41, wherein the gate is closer to the source than to the drain.

Example 44 includes the system of any one of examples 35-41, wherein the transistor further includes a high-k spacer between the first semiconductor material and the gate, the high-k spacer extending between the source and the drain.

Example 45 includes the system of example 44, wherein the transistor further includes a low-k spacer on the high-k spacer, the low-k spacer extending over the gate and between the source and the drain.

Example 46 includes the system of any one of examples 35-41, wherein the transistor further includes a semiconductor substrate, and an isolation material on the semiconductor substrate, the isolation material positioned between the second semiconductor material and the semiconductor substrate, the isolation material defining an opening at a location where the first semiconductor material is positioned.

Example 47 includes the system of any one of examples 35-41, wherein a first top surface of the first semiconductor material is lower than a second top surface of the second semiconductor material.

Example 48 includes the system of any one of examples 35-41, wherein the second semiconductor material is positioned within a recess in the first semiconductor material.

Example 49 includes the system of any one of examples 48, wherein a bottom surface of the recess of the first semiconductor material extends under the second semiconductor material.

Example 50 includes the system of any one of examples 35-41, further including a field plate positioned above the gate, the field plate in contact with a top surface of the gate.

Example 51 includes the system of any one of examples 35-41, further including a field plate indirectly connected to the gate via an interconnect, the field plate being vertically spaced apart from the gate.

Example 52 includes the system of any one of examples 35-41, wherein the first semiconductor material has a first carrier mobility that is greater than a second carrier mobility of the second semiconductor material.

Example 53 includes the system of any one of examples 35-41, wherein the first semiconductor material has a first band gap and the second semiconductor material has a second band gap, the second band gap being greater than the first band gap.

Example 54 includes the system of any one of examples 35-41, wherein a distance between the gate and the drain corresponds to a length of the second semiconductor material in a direction extending between the source and the drain.

Example 55 includes the system of any one of examples 35-41, wherein the first semiconductor material includes gallium and nitrogen.

Example 56 includes the system of any one of examples 35-41, wherein the second semiconductor material includes gallium, and oxygen.

Example 57 includes the system of example 56, wherein the second semiconductor material is doped with tin.

Example 58 includes a method of manufacturing an integrated circuit, the method comprising forming a first semiconductor material on a semiconductor substrate, forming a second semiconductor material adjacent the first semiconductor material, forming a source region adjacent the first semiconductor material and spaced apart from the second semiconductor material, forming a drain region adjacent the second semiconductor material and spaced apart from the first semiconductor material, and forming a gate between the source region and the drain region.

Example 59 includes the method of example 58, wherein the forming of the second semiconductor material includes epitaxially growing the second semiconductor material from a surface of the first semiconductor material.

Example 60 includes the method of example 59, wherein the surface is a side wall of the first semiconductor surface, the side wall being substantially perpendicular to a top surface of the first semiconductor material.

Example 61 includes the method of example 58, further including depositing a polarization layer on the first semiconductor material.

Example 62 includes the method of example 61, wherein the forming of the second semiconductor material includes epitaxially growing the second semiconductor material from the polarization layer.

Example 63 includes the method of example 61, further including planarizing a top surface of the polarization layer and a top surface of the second semiconductor material.

Example 64 includes the method of example 61, further including applying a hard mask to an outer surface of the polarization layer prior to forming the second semiconductor material, etching the hard mask to expose a side wall of the polarization layer, and epitaxially growing the second semiconductor from the side wall of the polarization layer.

Example 65 includes the method of any one of examples 58-64, wherein the forming of the second semiconductor material includes etching a portion of the first semiconductor material to define a recessed surface in the first semiconductor material, and epitaxially growing the second semiconductor material from the recessed surface, the recessed surface being substantially parallel to a top surface of the first semiconductor material.

Example 66 includes the method of any one of examples 58-64, wherein the forming of the second semiconductor material includes epitaxially growing the second semiconductor material a distance from a side wall of the first semiconductor material, the distance based on a voltage rating designated for the integrated circuit and based on a breakdown voltage of the second semiconductor material.

Example 67 includes the method of any one of examples 58-64, wherein the forming of the first semiconductor material includes epitaxially growing the first semiconductor material on a buffer layer formed on a semiconductor substrate.

Example 68 includes the method of example 67, wherein the epitaxially growing of the first semiconductor material includes growing the first semiconductor material with side walls substantially perpendicular to the substrate example 69 includes the method of any one of examples 58-64, further including depositing an isolation material layer onto the semiconductor substrate, and etching the isolation material layer to expose a location on the semiconductor substrate where the first semiconductor material is to be formed.

Example 70 includes the method of any one of examples 58-64, further including forming a high-k spacer positioned under the gate and between the source and the drain.

Example 71 includes the method of any one of examples 58-64, further including forming a field plate positioned above the gate and the drain.

Example 72 includes the method of example 71, further including forming a metal interconnect to electrically couple the gate to the field plate.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A transistor, comprising:
a first semiconductor material comprising gallium and nitrogen;
a second semiconductor material comprising gallium and oxygen, the second semiconductor material adjacent the first semiconductor material;
a source proximate the first semiconductor material and spaced apart from the second semiconductor material;
a drain proximate the second semiconductor material and spaced apart from the first semiconductor material;
a gate between the source and the drain; and
a polarization layer between the first semiconductor material and the gate, wherein the polarization layer extends along a side wall of the first semiconductor material, the second semiconductor material is in contact with the polarization layer along the side wall, and a lateral side of the gate substantially aligns with the side wall, wherein the side wall is proximate the second semiconductor material.

2. The transistor of claim 1, wherein the first and second semiconductor materials define respective first and second portions of a path for current to flow between the source and the drain.

3. The transistor of claim 2, wherein the gate, when energized, is to activate a controlled channel at an interface between a top surface of the first semiconductor material and the polarization layer, the controlled channel corresponding to the first portion of the path.

4. The transistor of claim 1, wherein the gate is in vertical alignment with the first semiconductor material and is laterally offset relative to the second semiconductor material.

5. The transistor of claim 1, further comprising:
a semiconductor substrate; and
an isolation material on the semiconductor substrate, the isolation material between the second semiconductor material and the semiconductor substrate, the isolation material not between a portion of the first semiconductor material and the semiconductor substrate.

6. The transistor of claim 1, further comprising a field plate in vertical alignment with the gate, the field plate electrically connected to the gate.

7. The transistor of claim 1, wherein the first semiconductor material has a first carrier mobility that is greater than a second carrier mobility of the second semiconductor material.

8. The transistor of claim 1, wherein the first semiconductor material has a first band gap and the second semiconductor material has a second band gap, the second band gap being wider than the first band gap.

9. A transistor, comprising:
a source structure comprising indium, gallium, and nitrogen;
a first semiconductor material in contact with and laterally adjacent to the source structure, the first semiconductor material comprising gallium and nitrogen;
a second semiconductor material laterally in series with the first semiconductor material, the second semiconductor material comprising gallium and oxygen;
a drain structure in contact with and laterally adjacent to the second semiconductor material, the drain structure comprising indium, gallium, and nitrogen, wherein the first semiconductor material is electrically coupled to the drain structure through the second semiconductor material;
a polarization layer between the first semiconductor material and a gate; and
a source contact directly on the source structure and a drain contact directly on the drain structure.

10. The transistor of claim 9, wherein the second semiconductor material comprises $Ga_2O_3$.

11. The transistor of claim 9, wherein a lateral side of the gate substantially aligns with a side wall of the first semiconductor material proximate to the second semiconductor material.

12. The transistor of claim 9, wherein the polarization layer extends along a side wall of the first semiconductor material, and the second semiconductor material is in contact with the polarization layer along the side wall.

13. The transistor of claim 9, wherein an electrical path from the source structure to the drain structure comprises the first semiconductor material and the second semiconductor material.

14. The transistor of claim 9, further comprising a dielectric layer on the polarization layer, wherein the gate is on the dielectric layer.

15. A transistor, comprising:
a first semiconductor material in contact with a source structure, the first semiconductor material comprising gallium and nitrogen;
a second semiconductor material adjacent the first semiconductor material, the second semiconductor material comprising gallium and oxygen;
a drain structure in contact with the second semiconductor material, wherein the source structure, the first semiconductor material, the second semiconductor material, and the drain structure comprise an electrical path, the electrical path comprising the first semiconductor material and the second semiconductor material in series between the source structure and the drain structure; and
a polarization layer between the first semiconductor material and a gate, the gate to control the electrical path between the source structure and the drain structure.

16. The transistor of claim 15, wherein a lateral side of the gate substantially aligns with a side wall of the first semiconductor material proximate to the second semiconductor material.

17. The transistor of claim 15, wherein the polarization layer extends along a side wall of the first semiconductor material, and the second semiconductor material is in contact with the polarization layer along the side wall.

18. The transistor of claim 15, further comprising a source contact on the source structure and a drain contact on the drain structure.

19. The transistor of claim 15, further comprising a dielectric layer on the polarization layer, wherein the gate is on the dielectric layer.

* * * * *